United States Patent
Kashiwa et al.

(10) Patent No.: US 7,598,806 B2
(45) Date of Patent: Oct. 6, 2009

(54) DISTORTION COMPENSATION CIRCUIT

(75) Inventors: Takuo Kashiwa, Nishinomiya (JP); Yoshifumi Ohnishi, Nishinomiya (JP)

(73) Assignee: Furuno Electric Company Limited, Nishinomiya (JP)

( * ) Notice: Subject to any disclaimer, the term of this patent is extended or adjusted under 35 U.S.C. 154(b) by 100 days.

(21) Appl. No.: 11/663,267

(22) PCT Filed: Jun. 28, 2005

(86) PCT No.: PCT/JP2005/011781

§ 371 (c)(1), (2), (4) Date: Mar. 20, 2007

(87) PCT Pub. No.: WO2006/033193

PCT Pub. Date: Mar. 30, 2006

(65) Prior Publication Data

US 2007/0262816 A1    Nov. 15, 2007

(30) Foreign Application Priority Data

Sep. 21, 2004    (JP) ............................. 2004-273764

(51) Int. Cl.
*H03F 1/26* (2006.01)
(52) U.S. Cl. ..................................... 330/149
(58) Field of Classification Search ................ 330/149; 455/114.3
See application file for complete search history.

(56) References Cited

U.S. PATENT DOCUMENTS 5,523,716 A    6/1996    Grebliunas et al.
5,798,854 A    8/1998    Blauvelt et al.
6,580,319 B1*  6/2003    Cummings et al. .......... 330/149
6,737,922 B2*  5/2004    Pengelly et al. ............. 330/295

FOREIGN PATENT DOCUMENTS

| JP | 8-181544 A | 7/1996 |
| JP | 11-355055 A | 12/1999 |
| JP | 2002-76784 A | 3/2002 |
| JP | 2002-523968 A | 7/2002 |
| JP | 2002-368546 A | 12/2002 |
| WO | WO-00/11816 A1 | 3/2000 |

OTHER PUBLICATIONS

Yamauchi et al., IEEE MTT-S Digest, 1996, pp. 831-834, "A Novel Series Diode Linearizer for Mobile Radio Power Amplifier" (E97161785).

\* cited by examiner

*Primary Examiner*—Steven J Mottola
(74) *Attorney, Agent, or Firm*—Birch, Stewart, Kolasch & Birch, LLP

(57) ABSTRACT

There is provided a distortion compensation circuit that can compensate for the nonlinearity of an amplifier having the characteristic that the gain is reduced and the phase is delayed with an increase in input power. An inductor 112 is connected in series with a diode 105 of a distortion compensation circuit 100. The resistance components of the diode 105 decrease with an increase in input power, so that the effect of the impedance of the inductor 112 connected in series with the diode 105 appears, and the impedance of the distortion compensation circuit 100 becomes inductive, producing the characteristic that the phase is advanced. At the same time, the resistance components of the diode 105 decrease with an increase in input power, thus producing the characteristic that the loss is reduced and the gain is increased.

4 Claims, 21 Drawing Sheets

DISTORTION COMPENSATION CIRCUIT

CROSS REFERENCE OF RELATED APPLICATION

PCT Application PCT/JP2005/011781 and Japanese Patent Application Tokugan No. 2004-273764 are hereby incorporated by reference.

TECHNICAL FIELD

The present invention relates to a distortion compensation circuit that is connected before or after an amplifier for use.

BACKGROUND ART

Although it is desirable that an amplifier used for a radio communications system or the like has the input-output characteristics that the gain and phase will not change, amplitude distortion and phase distortion occur in practice as input power is increased. Therefore, as shown in FIG. 18, the linearity of the amplifier is improved by connecting, before or after the amplifier, a distortion compensation circuit having input-output characteristics that cancel the nonlinearity of the amplifier.

Examples of conventional distortion compensation circuits include the technology described in Patent Document 1 or Non-patent Document 1. By way of an example, a distortion compensation circuit described in Non-patent Document 1 is shown in FIG. 20. As shown in FIG. 20, in a distortion compensation circuit 200, an input-side DC blocking capacitor 204, a diode 205 connected in the forward direction and an output-side DC blocking capacitor 206 are connected in this order in series with a signal path between an input terminal 201 and an output terminal 202. In addition, a capacitor 207 is connected in parallel with the diode 205. Then, one end of a bias circuit made up of a bias resistor 208 and a bias short circuit inductor 209 is connected to the signal path between the input-side DC blocking capacitor 204 and the diode 205, and the other end thereof is connected to a bias terminal 203. Further, one end of a bias short circuit inductor 210 is connected to the signal path between the diode 205 and the output-side DC blocking capacitor 206, and the other end thereof is grounded.

The operation of the distortion compensation circuit 200 is described next. A signal (RF) in the radio frequency band is input to the input terminal 201, passes through the input-side DC blocking capacitor 204 and is input to the diode 205. In addition, a bias voltage is applied to the diode 205 from the bias terminal 203 via the bias resistor 208. At this time, a signal waveform in the radio frequency band is clipped by the diode 205, generating a direct current. This direct current increases with an increase in input power in the radio frequency band. Then, the internal resistance of the diode 205 in the radio frequency band decreases with an increase of the direct current. The capacitor 207 thus provides, in accordance with its capacitance, a greater change in the phase characteristics than in the gain characteristics with respect to the input power.

By the above-described action, the distortion compensation circuit 200 of Non-patent Document 1 has the input-output characteristics that the gain is increased and the phase is delayed with an increase in input power. Accordingly, this circuit is effective for an amplifier having the characteristic that the gain is reduced and the phase is advanced with an increase in input power, as shown in FIG. 19, and the distortion compensation circuit 200 of Non-patent Document 1 is applied to an amplifier using a GaAsFET (Gallium Arsenide Field-Effect Transistor). Similarly, the distortion compensation circuit of Patent Document 1 has the input-output characteristics that the gain is increased and the phase is delayed with an increase in input power. Accordingly, this circuit is effective for an amplifier having the characteristic that the gain is reduced and the phase is advanced with an increase in input power, and the distortion compensation circuit of Patent Document 1 is applied to an amplifier or push-pull amplifier using a LDMOSFET (Laterally Diffused Metal Oxide Semiconductor Field-Effect Transistor).

Patent Document 1: JP2002-368546A

Non-patent Document 1: K. Yamauchi, et. al., "A novel series diode linearizer for mobile radio power amplifier," Proc. of Int. Microwave Symp., 1996, p. 831-834

DISCLOSURE OF INVENTION

Recently, however, high power amplifiers using a Si LDMOSFET, whose high-frequency characteristics are being improved significantly, have the characteristic that the gain is reduced and the phase is delayed with an increase in input power, as shown in FIG. 21. That is, a high power amplifier using a Si LDMOSFET has characteristics opposite to those of an amplifier using a GaAsFET, to which Non-patent Document 1 is applied, in terms of the phase. In other words, a conventional distortion compensation circuit as described in Non-patent Document 1 that is used for an amplifier using a GaAsFET does not have input-output characteristics that cancel the nonlinearity of a high power amplifier using a Si LDMOSFET, so that it cannot improve the linearity of a high power amplifier using a Si LDMOSFET.

Moreover, as described above, high power amplifiers using a Si LDMOSFET has the characteristic that the phase is temporarily advanced with an increase in input power, although it is eventually delayed. The distortion compensation circuit described in Patent Document 1 is applied in a range in which the phase is temporarily advanced. When the input power is increased beyond such a range, the circuit does not have input-output characteristics that cancel the nonlinearity of a high power amplifier using a Si LDMOSFET, so that it cannot improve the linearity of a high power amplifier using a Si LDMOSFET.

Therefore, the present invention provides a distortion compensation circuit that can compensate for the nonlinearity of an amplifier having the characteristic that the gain is reduced and the phase is delayed with an increase in input power.

A distortion compensation circuit according to a first aspect of the invention includes: a signal path in which an input terminal, an input-side DC blocking capacitor, a diode connected in a forward direction, an inductor, an output-side DC blocking capacitor, and an output terminal are connected in series in this order; a bias circuit whose one end is connected to the signal path between the input-side DC blocking capacitor and the diode and whose other end is connected to a bias terminal; a bias short circuit inductor whose one end is connected to the signal path between the inductor and the output-side DC blocking capacitor and whose other end is grounded; and a capacitor connected in parallel with the diode and the inductor.

According to this, the inductor is connected in series with the diode connected in series with the input terminal and the output terminal. Accordingly, the resistance components of the diode decrease with an increase in input power, so that the effect of the impedance of the inductor appears and the impedance of the distortion compensation circuit becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power. Specifically, "desired frequency" as used herein means a frequency band of high frequencies within the operating range of a high power amplifier to which the distortion compensation circuit is applied.

A distortion compensation circuit according to a second aspect of the invention includes: a signal path in which an input terminal, an input-side DC blocking capacitor, a diode connected in a forward direction, an output-side DC blocking capacitor, and an output terminal are connected in series in this order; a bias circuit whose one end is connected to the signal path between the input-side DC blocking capacitor and the diode and whose other end is connected to a bias terminal; a bias short circuit inductor whose one end is connected to the signal path between the diode and the output-side DC blocking capacitor and whose other end is grounded; and a series circuit comprising a capacitor and an inductor that are connected in parallel with the diode.

According to this, the inductor is connected in series with the capacitor connected in parallel with the diode connected in series with the input terminal and the output terminal. Accordingly, the resistance components of the diode decrease with an increase in input power, so that the effect of the impedance of the inductor appears and the impedance of the distortion compensation circuit becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power.

A distortion compensation circuit according to a third aspect of the invention includes: a signal path in which an input terminal, an input-side DC blocking capacitor, an output-side DC blocking capacitor, and an output terminal are connected in series in this order; a bias circuit whose one end is connected to the signal path between the input-side DC blocking capacitor and the output-side DC blocking capacitor and whose other end is connected to a bias terminal; a series circuit comprising a diode connected in a forward direction and whose one end is connected to the signal path between the input-side DC blocking capacitor and the output-side DC blocking capacitor and whose other end is grounded, and an inductor; and a capacitor connected in parallel with the diode and the inductor.

According to this, the inductor is connected in series with the diode whose one end is connected to the signal path between the input terminal and the output terminal and whose other end is grounded. Accordingly, the resistance components of the diode decrease with an increase in input power, so that the effect of the impedance of the inductor appears and the impedance of the distortion compensation circuit becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power.

A distortion compensation circuit according to a fourth aspect of the invention includes: a signal path in which an input terminal, an input-side DC blocking capacitor, an output-side DC blocking capacitor, and an output terminal are connected in series in this order; a bias circuit whose one end is connected to the signal path between the input-side DC blocking capacitor and the output-side DC blocking capacitor and whose other end is connected to a bias terminal; a diode connected in a forward direction and whose one end is connected to the signal path between the input-side DC blocking capacitor and the output-side DC blocking capacitor and whose other end is grounded; and a series circuit comprising a capacitor and an inductor that are connected in parallel with the diode.

According to this, the inductor is connected in series with the capacitor connected in parallel with the diode whose one end is connected to the signal path between the input terminal and the output terminal and whose other end is grounded. Accordingly, the resistance components of the diode decrease with an increase in input power, so that the effect of the impedance of the inductor appears and the impedance of the distortion compensation circuit becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power.

Here, in the distortion compensation circuits according to the first to fourth aspects of the invention, a transistor, whose gate is grounded, may be used in place of the diode.

According to this, an effect similar to that of the diode can be achieved by using the transistor whose gate is grounded in place of the diode and operating the transistor as a variable resistor by biasing it to a voltage near the pinch-off. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power.

A distortion compensation circuit according to a fifth aspect of the invention includes: a signal path in which an input terminal, a diode connected in a backward direction, and an output terminal are connected in series in this order; a resistor connected in parallel with the diode; and an inductor connected in parallel with the diode.

According to this, the diode connected in a backward direction and the inductor are connected in parallel. Accordingly, the resistance components of the diode decrease with an increase in input power, so that the effect of the impedance of the inductor appears and the impedance of the distortion compensation circuit becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier having the characteristic that the phase is delayed and the gain is decreased with an increase in input power.

Here, the distortion compensation circuits according to the first to fifth aspects of the invention may be pre- or post-connected to a high power amplifier using a Si LDMOSFET.

According to this, the distortion compensation circuits are connected before or after the high power amplifier using a Si LDMOSFET, so that it is possible to compensate a high power amplifier using a Si LDMOSFET and having the characteristic that the phase is delayed and the gain is decreased with an increase in input power.

A distortion compensation circuit according to a sixth aspect of the invention includes: a signal path in which an input terminal, a diode connected in a forward direction, and an output terminal are connected in series in this order; a resistor connected in parallel with the diode; and an inductor connected in parallel with the diode, wherein the distortion compensation circuit is pre- or post-connected to a multistage high power amplifier using a Si LDMOSFET.

According to this, it is possible to provide a distortion compensation circuit having the characteristic that only the phase is advanced, while the gain is maintained constant, by selecting the values of the inductor and the resistor, and the constant of the diode. Here, in the multistage high power amplifier using a Si LDMOSFET, the change with respect to increase in input power is more prominent for the phase delay than for the gain decrease, so that it is possible to improve the linearity even more efficiently by combining it with distortion compensation circuits having the characteristic that the gain is increased and the phase is advanced with an increase in input power (for example, the distortion compensation circuits according to the first to fifth aspects of the invention) or distortion compensation circuits in which the gain is increased, while the phase is maintained substantially constant.

BRIEF DESCRIPTION OF DRAWINGS

FIG. 10 is a graph showing the results of simulating the distortion compensation circuit according to the embodiment of the fifth aspect of the invention.

Figure 1:
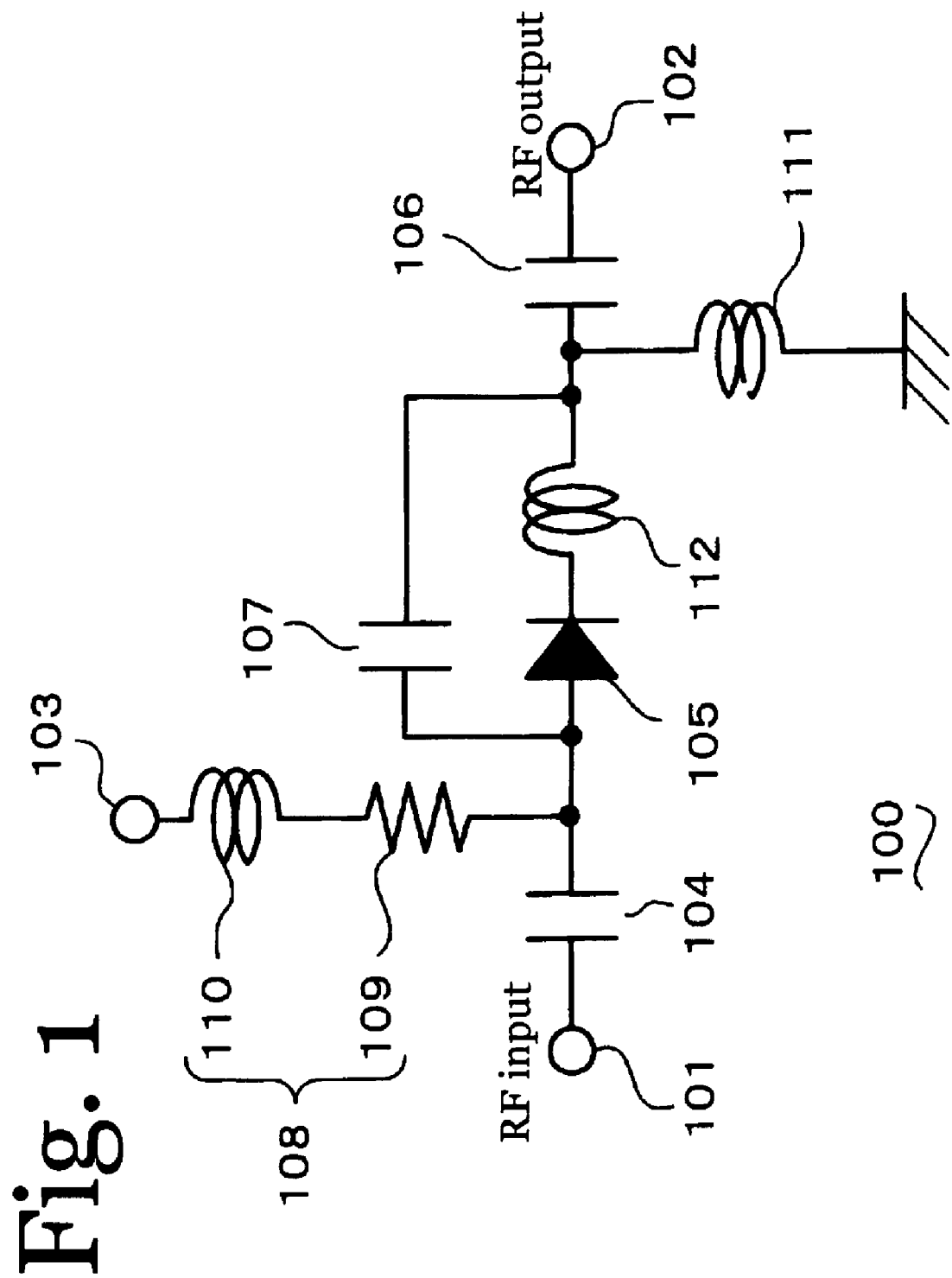
FIG. 1 is a circuit diagram showing a distortion compensation circuit according to an embodiment of the first aspect of the invention.

DESCRIPTION OF THE REFERENCE NUMERALS 100 distortion compensation circuit
101 input terminal
102 output terminal
103 bias terminal
104 input-side DC blocking capacitor
105 diode
106 output-side DC blocking capacitor
107 capacitor
108 bias circuit
111 bias short circuit inductor
112 inductor
114 transistor
115 anti-parallel diode pair

BEST MODE FOR CARRYING OUT THE INVENTION

In the following, the best mode for carrying out the distortion compensation circuits according the first to sixth aspects of the invention is described by way of specific examples with reference to the drawings. It should be noted that the distortion compensation circuits according to embodiments of the first to sixth aspects of the invention are described below on the assumption that they are connected before or after a Si LDMOSFET.

Embodiment of First Aspect of the Invention

First, a distortion compensation circuit according to an embodiment of the first aspect of the invention is described below with reference to FIG. 1. FIG. 1 is a circuit diagram showing a distortion compensation circuit according to an embodiment of the first aspect of the invention.

As shown in FIG. 1, in a distortion compensation circuit 100 according to the embodiment of the first aspect of the invention, an input-side DC blocking capacitor 104, a diode 105 connected in the forward direction, an inductor 112 and an output-side DC blocking capacitor 106 are connected in this order in series with a signal path between an input terminal 101 and an output terminal 102. In addition, a capacitor 107 is connected in parallel with the diode 105 and the inductor 112. Then, one end of a bias circuit 108 made up of a bias resistor 109 and a bias short circuit inductor 110 is connected to the signal path between the input-side DC blocking capacitor 104 and the diode 105, and the other end thereof is connected to a bias terminal 103. Further, one end of a bias short circuit inductor 111 is connected to the signal path between the diode 105 and the output-side DC blocking capacitor 106, and the other end thereof is grounded. Here, the diode 105 may be any diode whose impedance changes depending on an applied voltage.

Next, the operation of the distortion compensation circuit 100 according to the embodiment of the first aspect of the invention is described. A signal (RF) in the radio frequency band is input to the input terminal 101, passes through the input-side DC blocking capacitor 104 and is input to the diode 105. In addition, a bias voltage is applied to the diode 105 from the bias terminal 103 via the bias resistor 109. In the distortion compensation circuit 100, the resistance components (internal resistance) of the diode 105 in the radio frequency band decrease with an increase in input power, so that the effect of the impedance of the inductor 112 connected in series with the diode 105 appears. That is, as the input power is increased, the impedance of the distortion compensation circuit 100 becomes inductive due to the effect of the impedance of the inductor 112, thus producing the characteristic that the phase is advanced. At the same time, the resistance components of the diode 105 decrease with an increase in input power, thus producing the characteristic that the loss is reduced and the gain is increased.

Here, the capacitor 107 connected in parallel with the diode 105 also functions as a bypass capacitor for high frequency signals. In other words, it compensates for a loss when the input power is low. Furthermore, the bias short circuit inductor 110 of the bias circuit 108 functions as a choke coil. It should be noted that an RF short circuit capacitor whose one end is connected to the signal path between the bias resistor 109 and the bias terminal 103 and whose other end is grounded may also be used in place of the bias short circuit inductor 110 in the bias circuit 108. The bias short circuit inductor 111 functions as a choke coil, and allows a direct current component passed through the diode 105 to be passed to ground, providing a DC return function for the diode 105. A bias power supply connected to the bias terminal 103 is used for adjusting the input threshold level of the gain and phase change of the diode 105.

Figure 2:
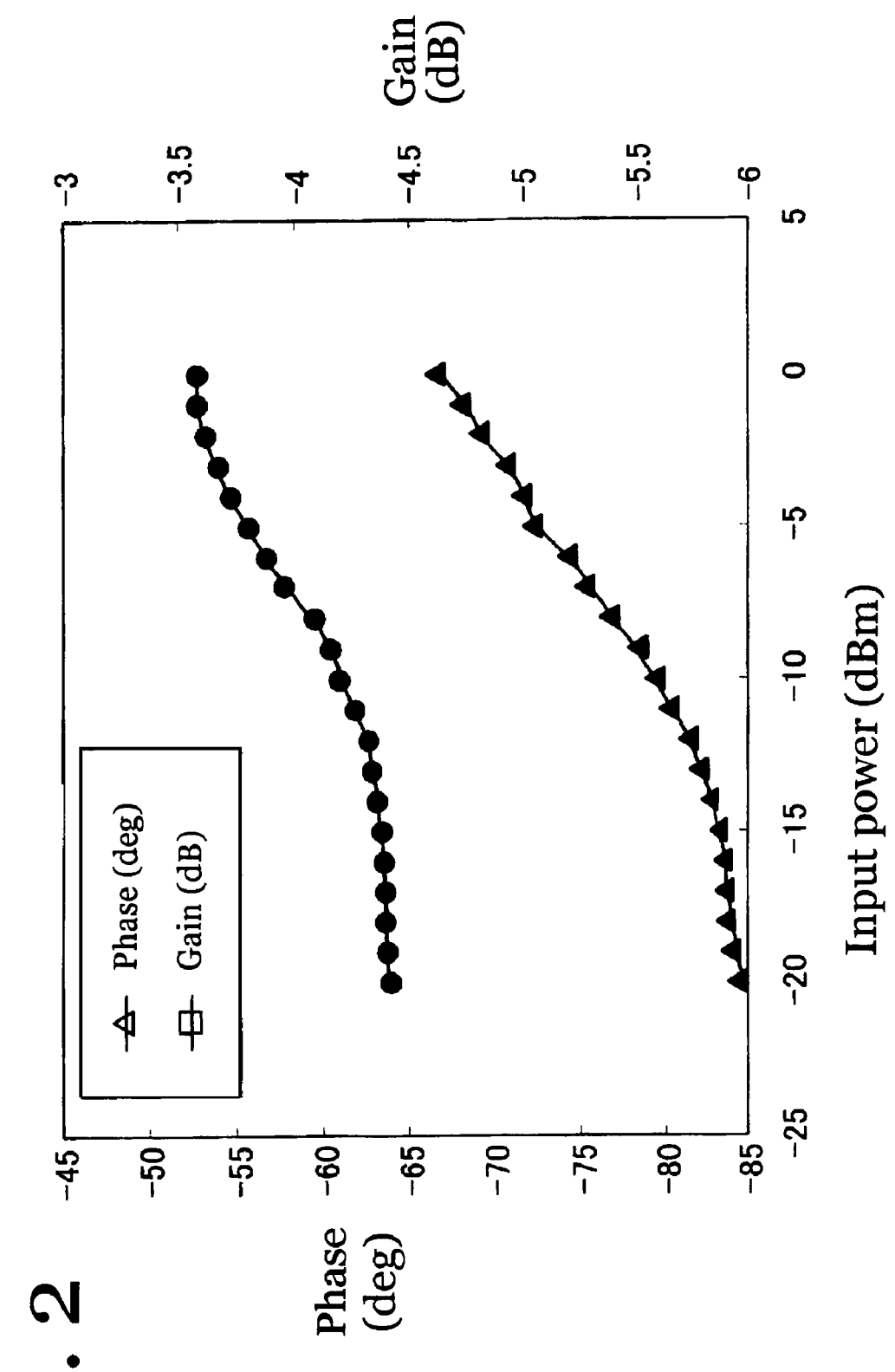
FIG. 2 is a graph showing the results of simulating the distortion compensation circuit according to the embodiment of the first aspect of the invention.

FIG. 2 shows the results of simulating the distortion compensation circuit 100 according to the above-described first embodiment at a frequency of 2 GHz. In the simulation, the junction capacitance of the diode 105 when 0 V was applied to it was set to 0.5 pF, the value of the inductor 112 was set to 5.5 nH, and the value of the capacitor 107 was set to 0.4 pF. As shown in FIG. 2, the distortion compensation circuit 100 has the characteristic that the gain is increased and the phase is advanced with an increase in input power.

As described above, with the distortion compensation circuit 100 according to the embodiment of the first aspect of the invention, the inductor 112 is connected in series with the diode 105 connected in series with the input terminal 101 and the output terminal 102. Accordingly, the resistance components of the diode 105 decrease with an increase in input power, so that the effect of the impedance of the inductor 112 appears and the impedance of the distortion compensation circuit 100 becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a high power amplifier using a Si LDMOSFET and having the characteristic that the phase is delayed and the gain is decreased with an increase in input power.

Embodiment of Second Aspect of the Invention

Figure 3:
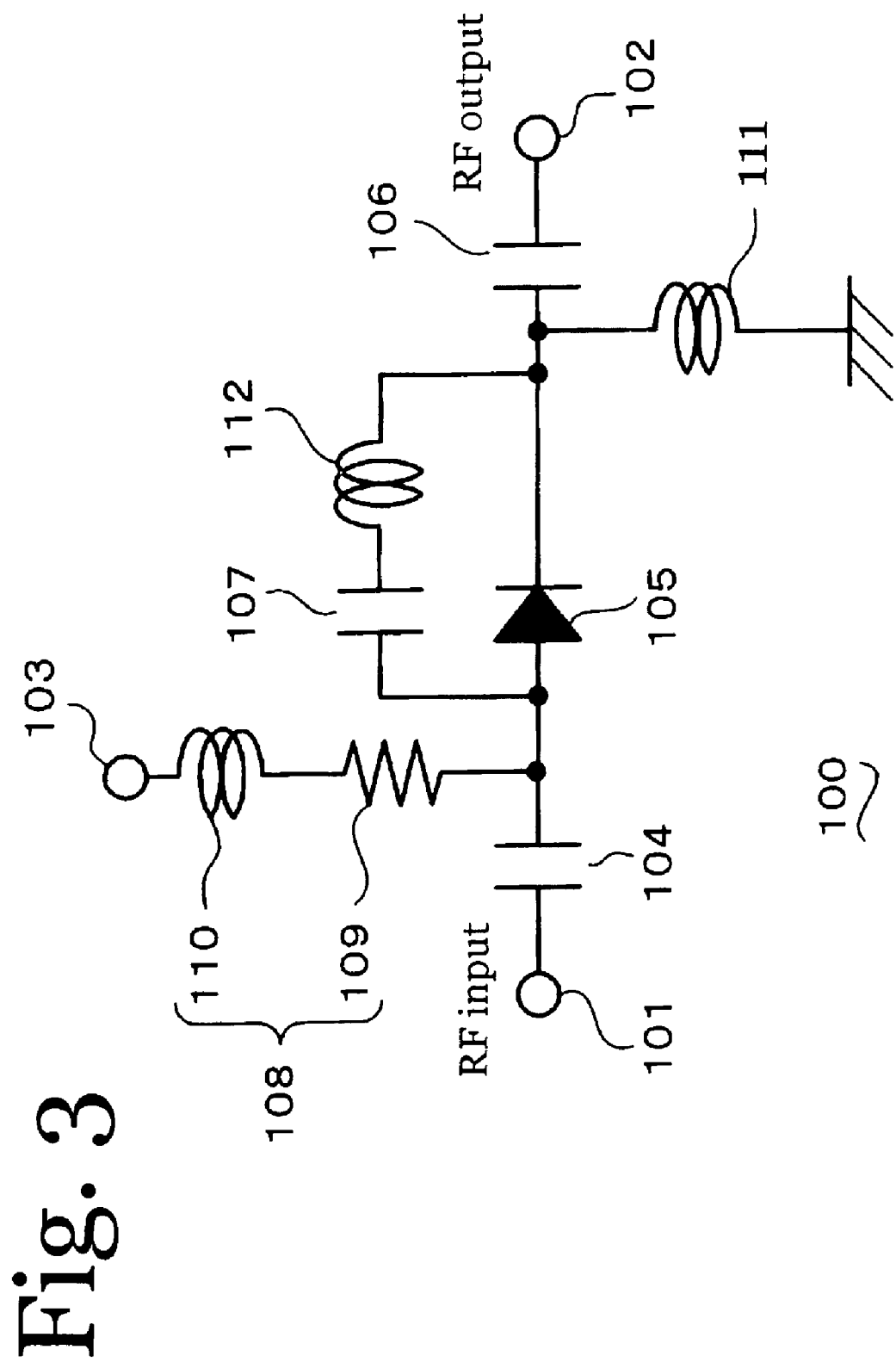
FIG. 3 is a circuit diagram showing a distortion compensation circuit according to an embodiment of the second aspect of the invention.

Next, a distortion compensation circuit according to a second embodiment is described below with reference to FIG. 3. FIG. 3 is a circuit diagram showing a distortion compensation circuit according to an embodiment of the second aspect of the invention.

As shown in FIG. 3, in a distortion compensation circuit 100 according to the second embodiment, an input-side DC blocking capacitor 104, a diode 105 connected in the forward direction and an output-side DC blocking capacitor 106 are connected in this order in series with a signal path between an input terminal 101 and an output terminal 102. In addition, a capacitor 107 and an inductor 112 that are connected in series are connected in parallel with the diode 105. One end of a bias circuit 108 made up of a bias resistor 109 and a bias short circuit inductor 110 is connected to the signal path between the input-side DC blocking capacitor 104 and the diode 105, and the other end thereof is connected to a bias terminal 103. Further, one end of a bias short circuit inductor 111 is connected to the signal path between the diode 105 and the output-side DC blocking capacitor 106, and the other end thereof is grounded. Here, the diode 105 may be any diode whose impedance changes depending on an applied voltage.

Next, the operation of the distortion compensation circuit 100 according to the second embodiment is described. A signal (RF) in the radio frequency band is input to the input terminal 101, passes through the input-side DC blocking capacitor 104 and is input to the diode 105. In addition, a bias voltage is applied to the diode 105 from the bias terminal 103 via the bias resistor 109. In the distortion compensation circuit 100, the resistance components (internal resistance) of the diode 105 in the radio frequency band decrease with an increase in input power, so that a direct current bypasses the capacitor 107 and the inductor 112 that are connected in parallel with the diode 105. Accordingly, the effect of the impedance of the inductor 112 connected in parallel with the diode 105 appears. That is, as the input power is increased, the impedance of the distortion compensation circuit 100 becomes inductive due to the effect of the impedance of the inductor 112, thus producing the characteristic that the phase is advanced. At the same time, the resistance components of the diode 105 decrease with an increase in input power, thus producing the characteristic that the loss is reduced and the gain is increased.

Here, the capacitor 107 connected in parallel with the diode 105 also functions as a bypass capacitor for high frequency signals. In other words, it compensates for a loss when the input power is low. Furthermore, the bias short circuit inductor 110 of the bias circuit 108 functions as a choke coil. It should be noted that an RF short circuit capacitor whose one end is connected to the signal path between the bias resistor 109 and the bias terminal 103 and whose other end is grounded may also be used in place of the bias short circuit inductor 110 in the bias circuit 108. The bias short circuit inductor 111 functions as a choke coil, and allows a direct current component passed through the diode 105 to be passed to ground, providing a DC return function for the diode 105. A bias power supply connected to the bias terminal 103 is used for adjusting the input threshold level of the gain and phase change of the diode 105.

Figure 4:
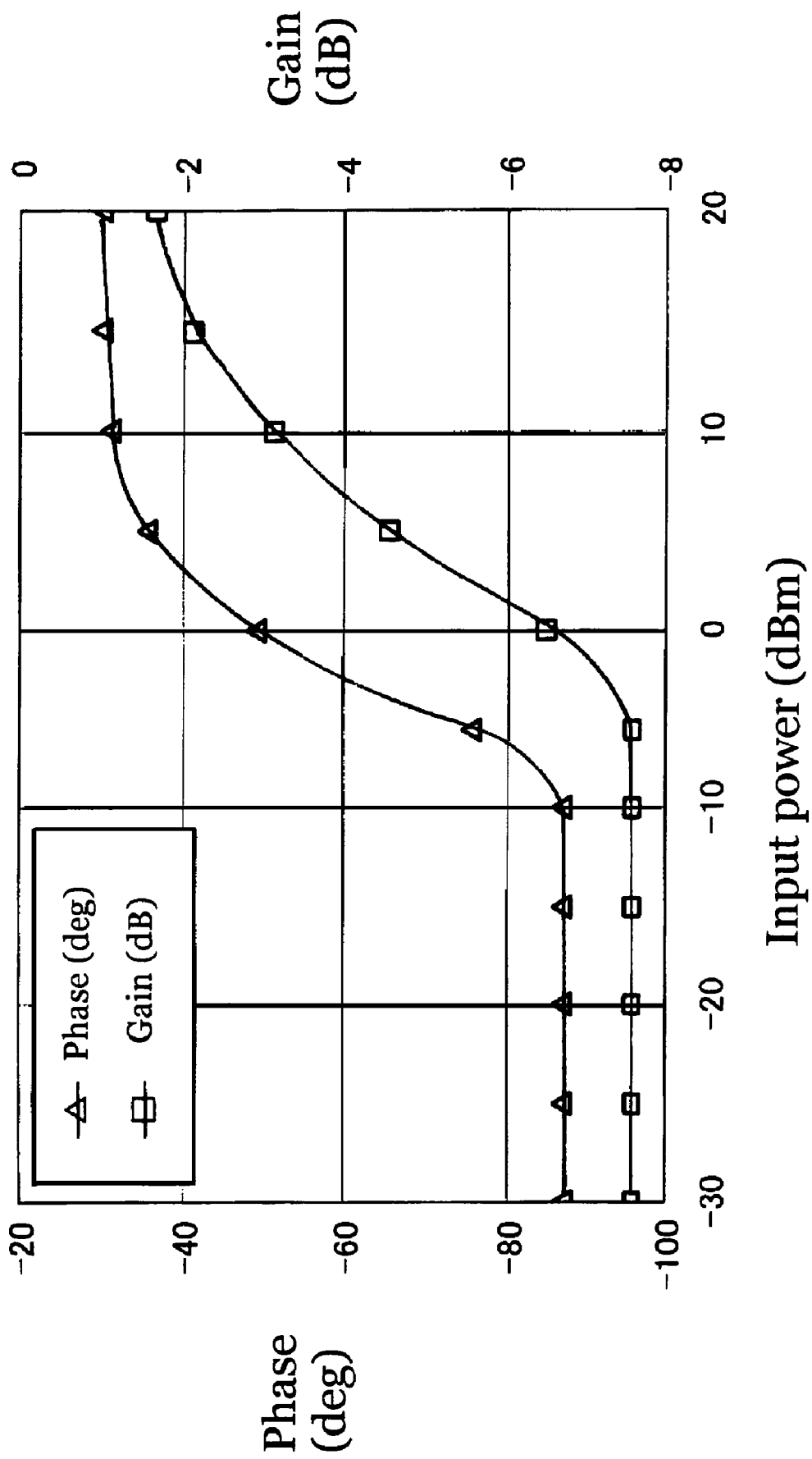
FIG. 4 is a graph showing the results of simulating the distortion compensation circuit according to the embodiment of the second aspect of the invention.

FIG. 4 shows the results of simulating the distortion compensation circuit 100 according to the above-described second embodiment at a frequency of 2 GHz. In the simulation, the junction capacitance of the diode 105 when 0 V was applied to it was set to 0.5 pF, the value of the inductor 112 to 5.5 nH, and the value of the capacitor 107 to 0.4 pF. As shown in FIG. 4, the distortion compensation circuit 100 has the characteristic that the gain is increased and the phase is advanced with an increase in input power.

As described above, with the distortion compensation circuit 100 according to the embodiment of the second aspect of the invention, the inductor 112 is connected in series with the capacitor 107 connected in parallel with the diode 105 connected in series with the input terminal 101 and the output terminal 102. Accordingly, the resistance components of the diode 105 decrease with an increase in input power, so that the effect of the impedance of the inductor 112 appears and the impedance of the distortion compensation circuit 100 becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a Si LDMOS-FET high power amplifier having the characteristic that the phase is delayed and the gain is decreased with an increase in input power.

Embodiment of Third Aspect of the Invention

Figure 5:
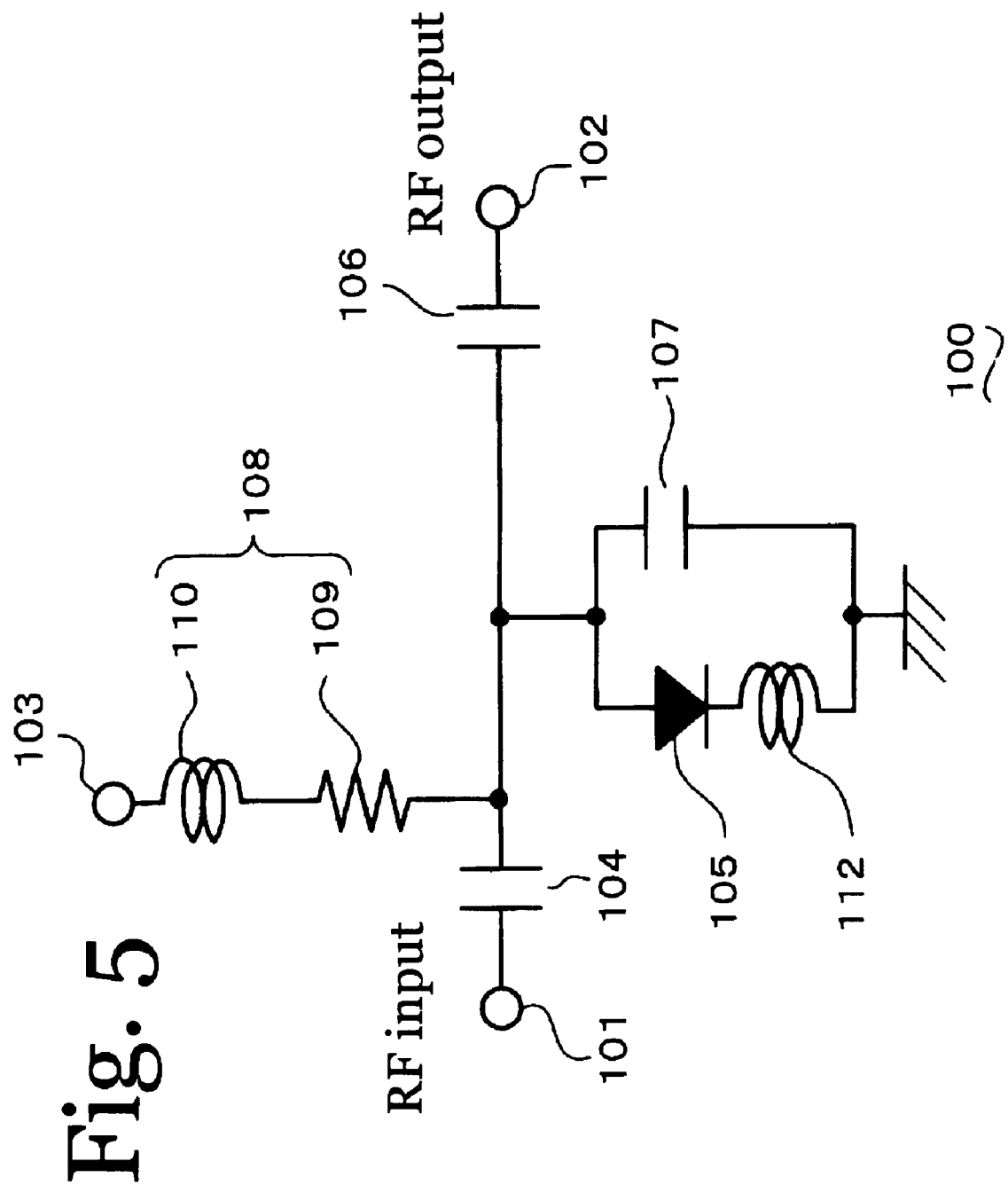
FIG. 5 is a circuit diagram showing a distortion compensation circuit according to an embodiment of the third aspect of the invention.

Next, a distortion compensation circuit according to an embodiment of the third aspect of the invention is described below with reference to FIG. 5. FIG. 5 is a circuit diagram showing a distortion compensation circuit according to an embodiment of the third aspect of the invention.

As shown in FIG. 5, in a distortion compensation circuit 100 according to an embodiment of the third aspect of the invention, an input-side DC blocking capacitor 104 and an output-side DC blocking capacitor 106 are connected in this order in series with a signal path between an input terminal 101 and an output terminal 102. One end of a series circuit made up of a diode 105 connected in the forward direction and an inductor 112 is connected to the signal path between the input-side DC blocking capacitor 104 and the output-side DC blocking capacitor 106, and the other end thereof is grounded. In addition, a capacitor 107 is connected in parallel with the diode 105 and the inductor 112. Moreover, one end of a bias circuit 108 made up of a bias resistor 109 and a bias short circuit inductor 110 is connected to the signal path between the input-side DC blocking capacitor 104 and the output-side DC blocking capacitor 106, and the other end thereof is connected to a bias terminal 103. Here, the diode 105 may be any diode whose impedance changes depending on an applied voltage.

Next, the operation of the distortion compensation circuit 100 according to the embodiment of the third aspect of the invention is described. A signal (RF) in the radio frequency band is input to the input terminal 101, passes through the input-side DC blocking capacitor 104 and is input to the diode 105. In addition, a bias voltage is applied to the diode 105 from the bias terminal 103 via the bias resistor 109. In the distortion compensation circuit 100, the resistance components (internal resistance) of the diode 105 in the radio frequency band decrease with an increase in input power, so that the effect of the impedance of the inductor 112 connected in series with the diode 105 appears. That is, as the input power is increased, the impedance of the distortion compensation circuit 100 becomes inductive due to the effect of the impedance of the inductor 112, thus producing the characteristic that the phase is advanced. At the same time, the resistance components of the diode 105 decrease with an increase in input power, thus producing the characteristic that the loss is reduced and the gain is increased. Additionally, since one end of the diode 105 is grounded, a direct current component passed through the diode 105 is passed to ground, providing a DC return function for the diode 105.

Here, the capacitor 107 connected in parallel with the diode 105 also functions as a bypass capacitor for high frequency signals. In other words, it compensates for a loss when the input power is low. Furthermore, the bias short circuit inductor 110 of the bias circuit 108 functions as a choke coil. It should be noted that an RF short circuit capacitor whose one end is connected to the signal path between the bias resistor 109 and the bias terminal 103 and whose other end is grounded may also be used in place of the bias short circuit inductor 110 in the bias circuit 108. A bias power supply connected to the bias terminal 103 is used for adjusting the input threshold level of the gain and phase change of the diode 105.

Figure 6:
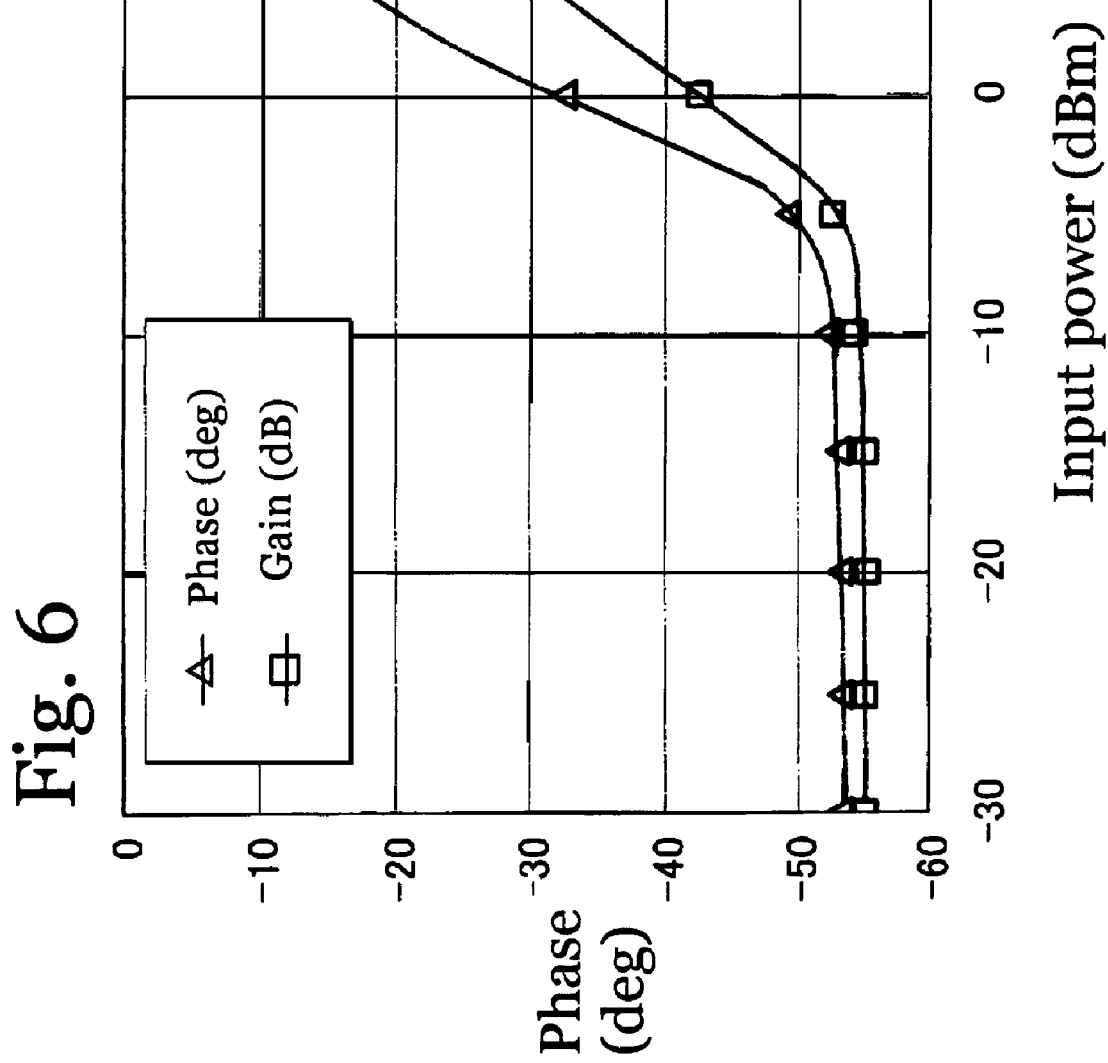
FIG. 6 is a graph showing the results of simulating the distortion compensation circuit according to the embodiment of the third aspect of the invention.

FIG. 6 shows the results of simulating the distortion compensation circuit 100 according to the above-described third embodiment at a frequency of 2 GHz. In the simulation, the junction capacitance of the diode 105 when 0 V was applied to it was set to 0.5 pF, the value of the inductor 112 was set to 5.5 nH, and the value of the capacitor 107 was set to 0.4 pF. As shown in FIG. 6, the distortion compensation circuit 100 has the characteristic that the gain is increased and the phase is advanced with an increase in input power.

As described above, with the distortion compensation circuit 100 according to the embodiment of the third aspect of the invention, the inductor 112 is connected in series with the diode 105 whose one end is connected to the signal path between the input terminal 101 and the output terminal 102 and whose other end is grounded. Accordingly, the resistance components of the diode 105 decrease with an increase in input power, so that the effect of the impedance of the inductor 112 appears and the impedance of the distortion compensation circuit 100 becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a Si LDMOSFET having the characteristic that the phase is delayed and the gain is decreased with an increase in input power.

Embodiment of Fourth Aspect of the Invention

Figure 7:
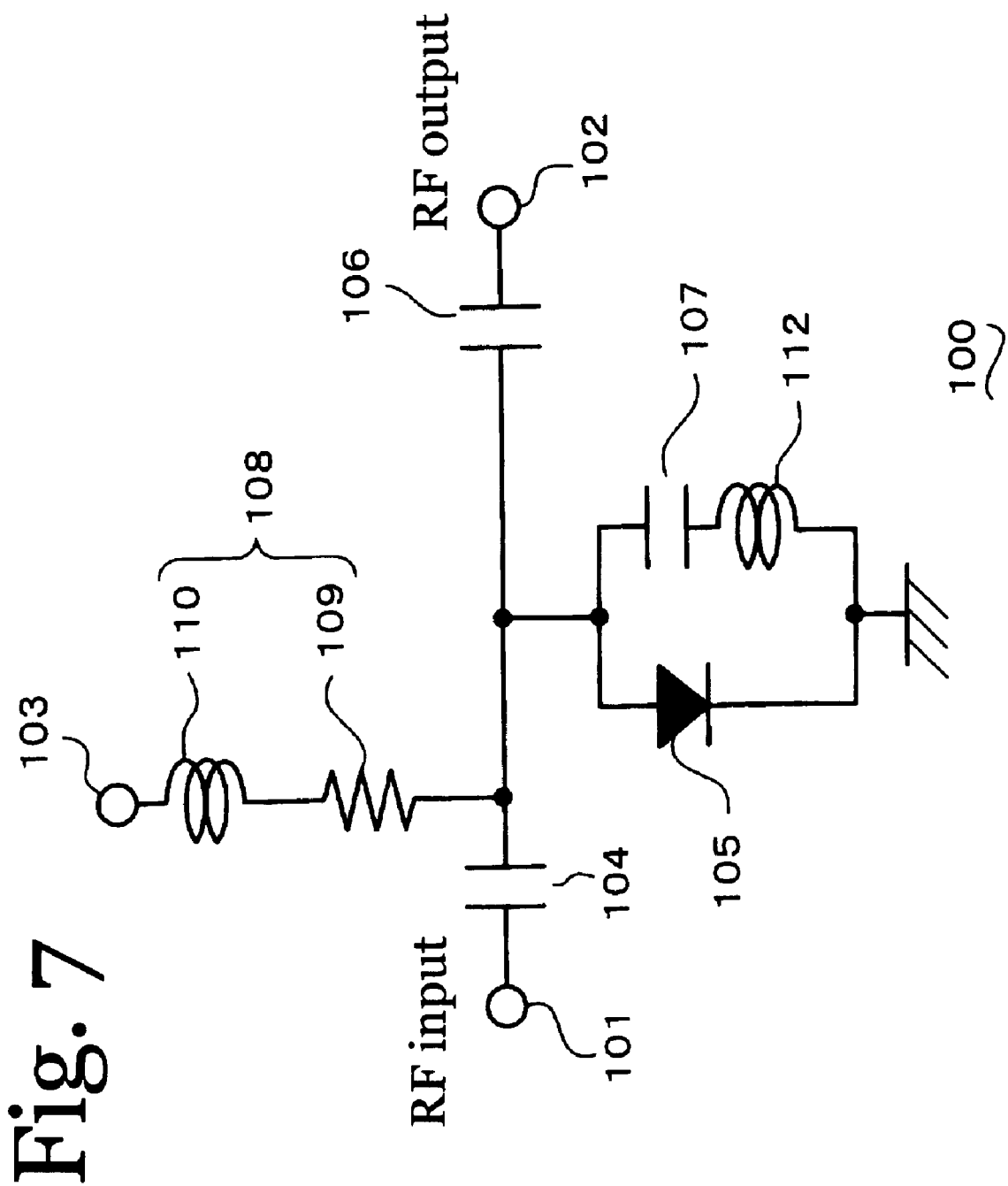
FIG. 7 is a circuit diagram showing a distortion compensation circuit according to an embodiment of the fourth aspect of the invention.

Next, a distortion compensation circuit according to an embodiment of the fourth aspect of the invention is described below with reference to FIG. 7. FIG. 7 is a circuit diagram showing a distortion compensation circuit according to an embodiment of the fourth aspect of the invention.

As shown in FIG. 7, in a distortion compensation circuit 100 according to the embodiment of the fourth aspect of the invention, an input-side DC blocking capacitor 104 and an output-side DC blocking capacitor 106 are connected in this order in series with a signal path between an input terminal 101 and an output terminal 102. One end of a diode 105 connected in the forward direction is connected to the signal path between the input-side DC blocking capacitor 104 and the output-side DC blocking capacitor 106, and the other end thereof is grounded. In addition, a capacitor 107 and an inductor 112 that are connected in series are connected in parallel with the diode 105. Moreover, one end of a bias circuit 108 made up of a bias resistor 109 and a bias short circuit inductor 110 is connected to the signal path between the input-side DC blocking capacitor 104 and the output-side DC blocking capacitor 106, and the other end thereof is connected to a bias terminal 103. Here, the diode 105 may be any diode whose impedance changes depending on an applied voltage.

Next, the operation of the distortion compensation circuit 100 according to the embodiment of the fourth aspect of the invention is described. A signal (RF) in the radio frequency band is input to the input terminal 101, passes through the input-side DC blocking capacitor 104 and is input to the diode 105. In addition, a bias voltage is applied to the diode 105 from the bias terminal 103 via the bias resistor 109. In the distortion compensation circuit 100, the resistance components (internal resistance) of the diode 105 in the radio frequency band decrease with an increase in input power, so that a direct current bypasses the capacitor 107 and the inductor 112 that are connected in parallel with the diode 105. Accordingly, the effect of the impedance of the inductor 112 connected in parallel with the diode 105 appears. That is, as the input power is increased, the impedance of the distortion compensation circuit 100 becomes inductive due to the effect of the impedance of the inductor 112, thus producing the characteristic that the phase is advanced. At the same time, the resistance components of the diode 105 decrease with an increase in input power, thus producing the characteristic that the loss is reduced and the gain is increased. Additionally, since one end of the diode 105 is grounded, a direct current component passed through the diode 105 is passed to ground, providing a DC return function for the diode 105.

Here, the capacitor 107 connected in parallel with the diode 105 also functions as a bypass capacitor for high frequency signals. In other words, it compensates for a loss when the input power is low. Furthermore, the bias short circuit inductor 110 of the bias circuit 108 functions as a choke coil. It should be noted that an RF short circuit capacitor whose one end is connected to the signal path between the bias resistor 109 and the bias terminal 103 and whose other end is grounded may also be used in place of the bias short circuit inductor 110 in the bias circuit 108. A bias power supply connected to the bias terminal 103 is used for adjusting the input threshold level of the gain and phase change of the diode 105.

Figure 8:
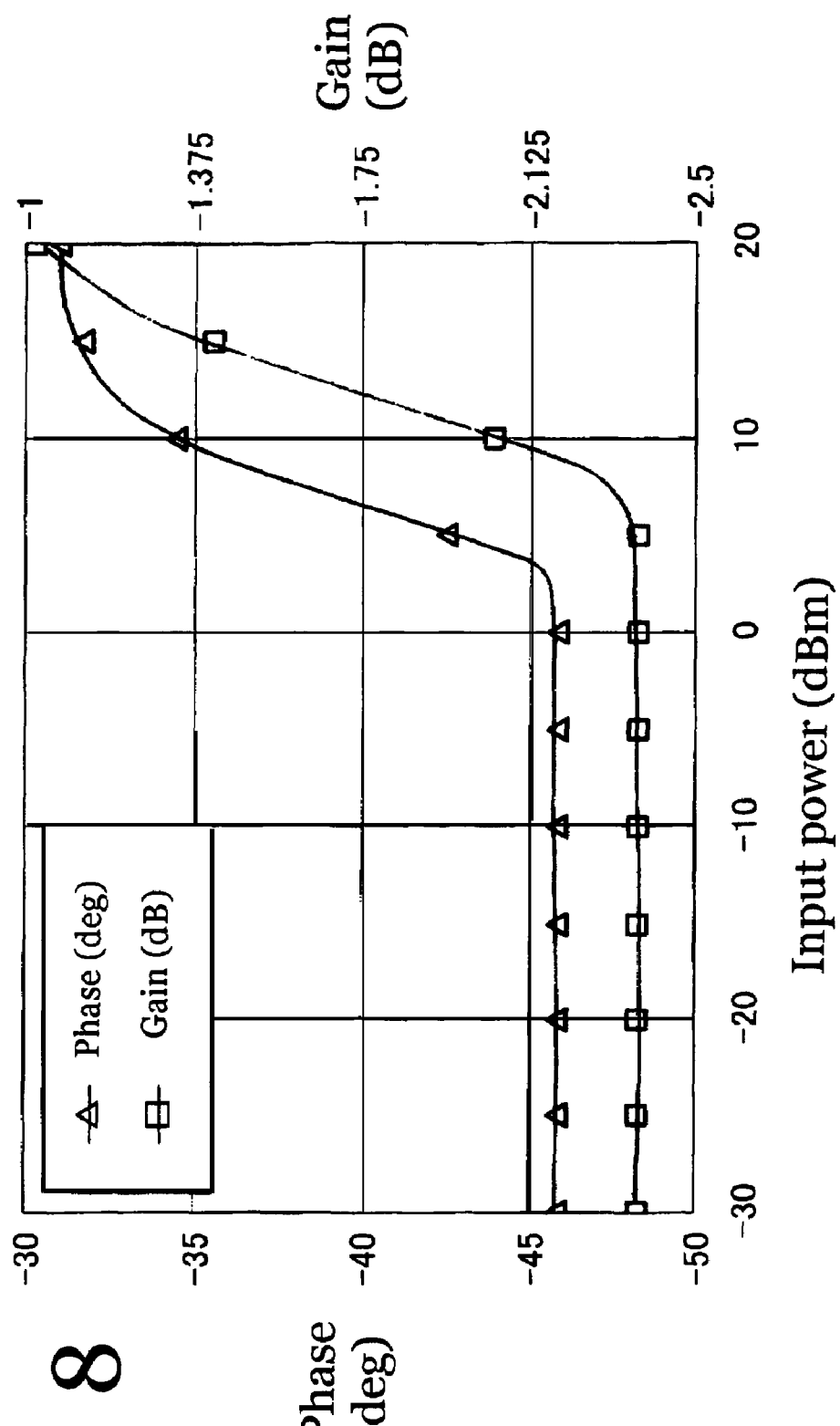
FIG. 8 is a graph showing the results of simulating the distortion compensation circuit according to the embodiment of the fourth aspect of the invention.

FIG. 8 shows the results of simulating the distortion compensation circuit 100 according to the above-described fourth embodiment at a frequency of 2 GHz. In the simulation, the junction capacitance of the diode 105 when 0 V was applied to it was set to 0.5 pF, the value of the inductor 112 was set to 5.5 nH, and the value of the capacitor 107 was set to 0.4 pF. As shown in FIG. 8, the distortion compensation circuit 100 has the characteristic that the gain is increased and the phase is advanced with an increase in input power.

As described above, with the distortion compensation circuit 100 according to the embodiment of the fourth aspect of the invention, the inductor 112 is connected in series with the capacitor 107 connected in parallel with the diode 105 whose one end is connected to the signal path between the input terminal 101 and the output terminal 102 and whose other end is grounded. Accordingly, the resistance components of the diode 105 decrease with an increase in input power, so that the effect of the impedance of the inductor 112 appears and the impedance of the distortion compensation circuit 100 becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a Si LDMOSFET high power amplifier having the characteristic that the phase is delayed and the gain is decreased with an increase in input power.

Embodiment of Fifth Aspect of the Invention

Figure 9:
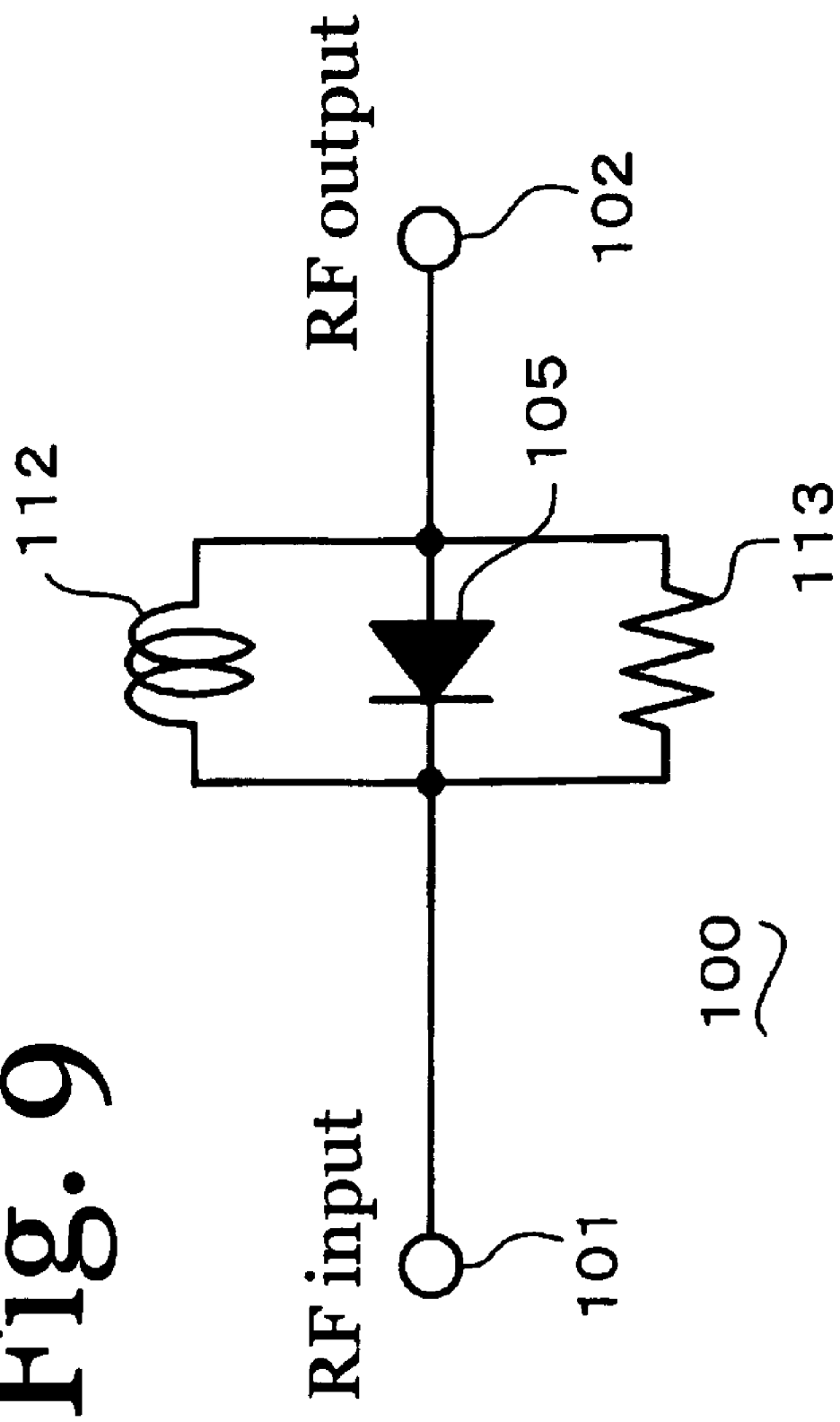
FIG. 9 is a circuit diagram showing a distortion compensation circuit according to an embodiment of the fifth aspect of the invention.

Next, a distortion compensation circuit according to an embodiment of the fifth aspect of the invention is described below with reference to FIG. 9. FIG. 9 is a circuit diagram showing a distortion compensation circuit according to an embodiment of the fifth aspect of the invention.

As shown in FIG. 9, in a distortion compensation circuit 100 according to an embodiment of the fifth aspect of the invention, a diode 105 connected in the backward direction is connected in series with a signal path between an input terminal 101 and an output terminal 102. In addition, an inductor 112 is connected in parallel with the diode 105. Furthermore, a resistor 113 is connected in parallel with the diode 105. Here, the diode 105 may be any diode whose impedance changes depending on an applied voltage.

Next, the operation of the distortion compensation circuit 100 according to the embodiment of the fifth aspect of the invention is described. A signal (RF) in the radio frequency band is input to the input terminal 101, and input to the diode 105. In the distortion compensation circuit 100, the resistance components (internal resistance) of the diode 105 in the radio frequency band decrease with an increase in input power, so that a direct current bypasses the inductor 112 connected in parallel with the diode 105, and the resistor 113 connected in parallel with the diode 105. Accordingly, the effect of the impedance of the inductor 112 connected in parallel with the diode 105 appears. That is, as the input power is increased, the impedance of the distortion compensation circuit 100 becomes inductive due to the effect of the impedance of the inductor 112, thus producing the characteristic that the phase is advanced. At the same time, the resistance components of the diode 105 decrease with an increase in input power, thus producing the characteristic that the loss is reduced and the gain is increased.

Figure 10:
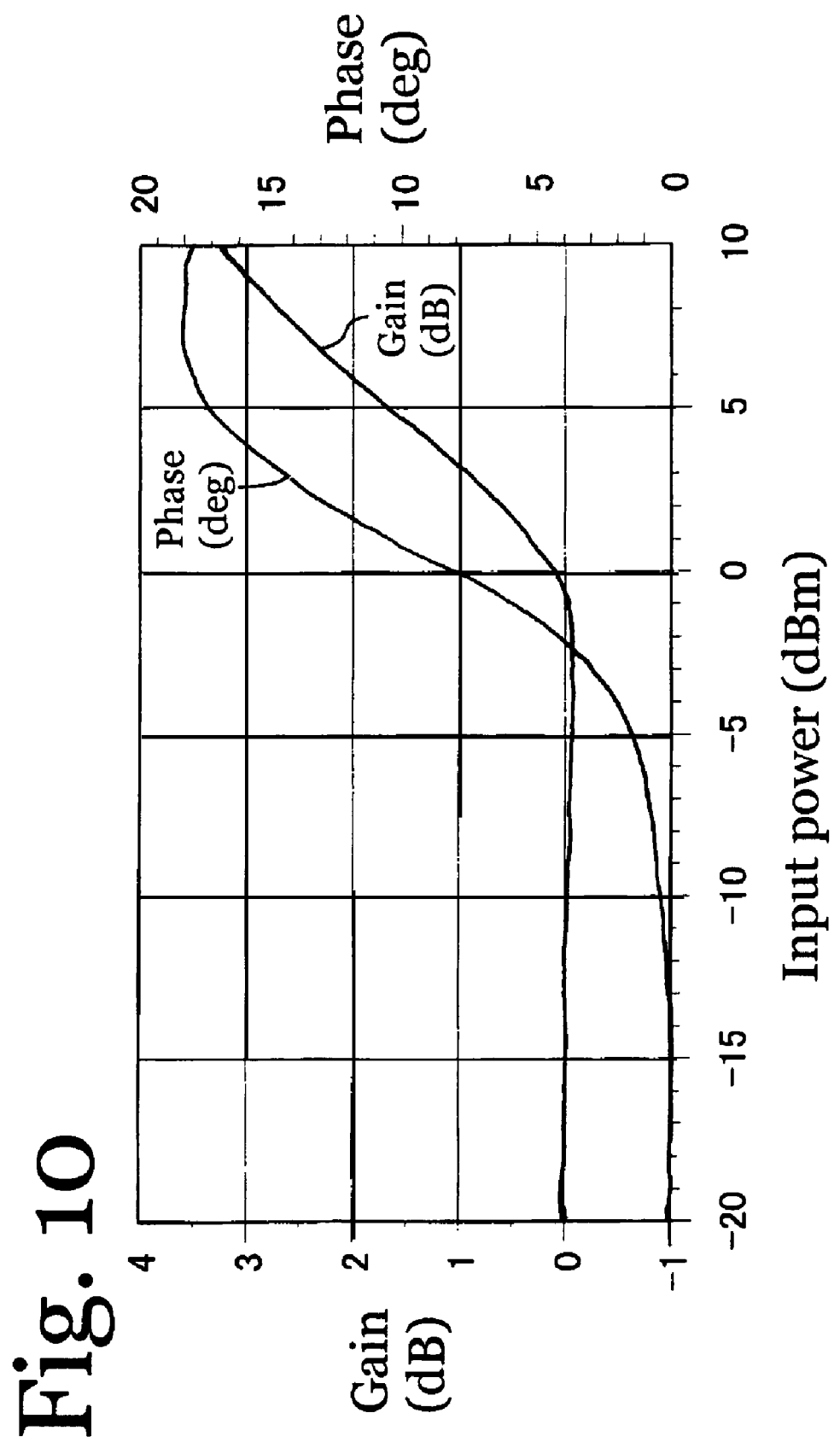

FIG. 10 shows the results of simulating the distortion compensation circuit 100 according to the above-described fifth embodiment at a frequency of 1.64 GHz. In the simulation, the junction capacitance of the diode 105 when 0 V was applied to it was set to 0.5 pF, the value of the inductor 112 was set to 4.7 nH, and the value of the resistor 113 was set to 50 Ohm. As shown in FIG. 10, the distortion compensation circuit 100 has the characteristic that the gain is increased and the phase is advanced with an increase in input power.

As described above, with the distortion compensation circuit 100 according to the embodiment of the fifth aspect of the invention, the diode 105 connected in the backward direction and the inductor 112 are connected in parallel. Accordingly, the resistance components of the diode 105 decrease with an increase in input power, so that the effect of the impedance of the inductor 112 appears and the impedance of the distortion compensation circuit 100 becomes inductive at a desired frequency, making it possible to achieve the characteristic that the phase is advanced. Consequently, it is possible to achieve the characteristic that the phase is advanced with an increase in input power, and the characteristic that the gain is increased with an increase in input power, so that it is possible to compensate a Si LDMOSFET high power amplifier having the characteristic that the phase is delayed and the gain is decreased with an increase in input power.

Embodiment of Sixth Aspect of the Invention

Figure 11:
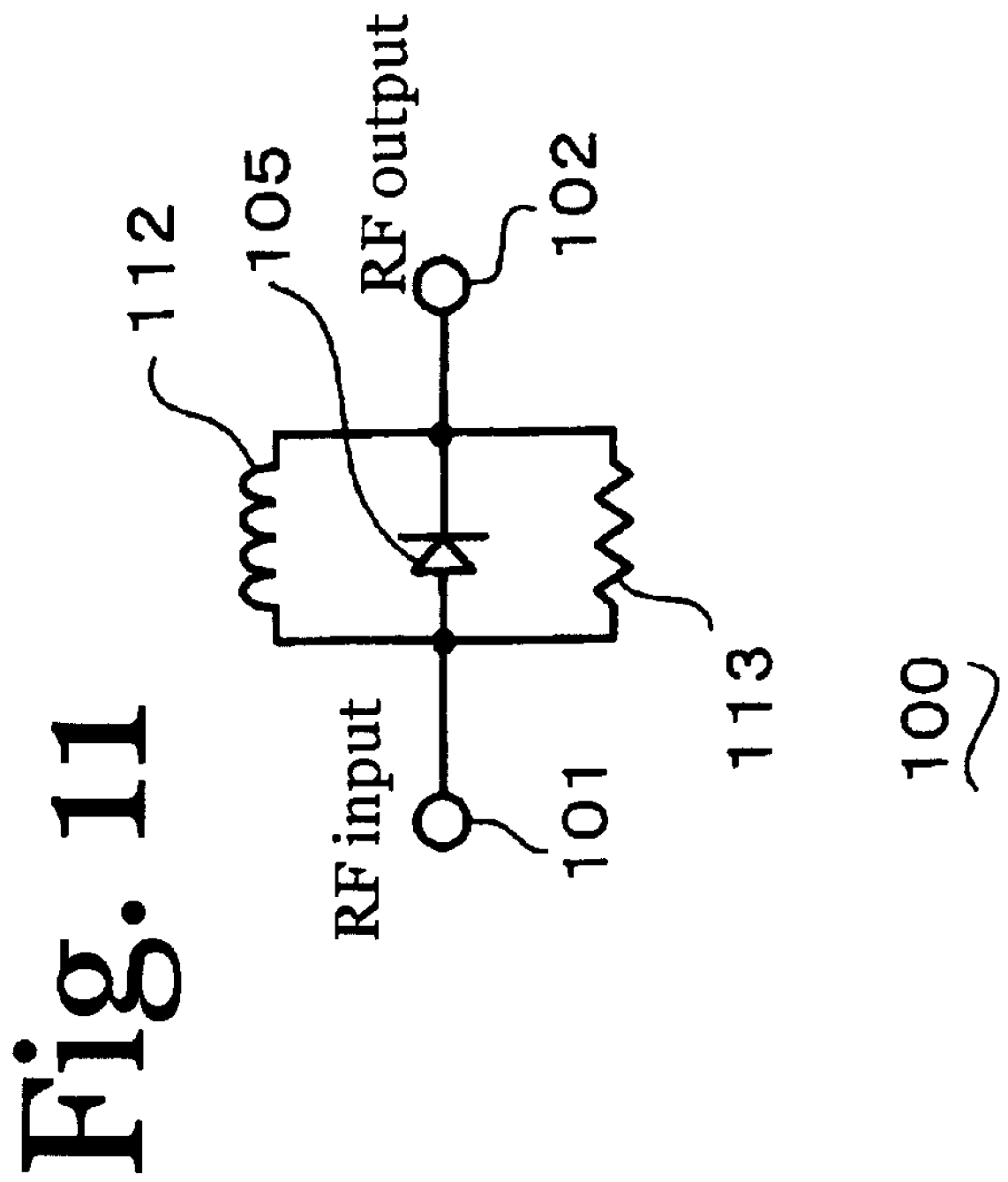
FIG. 11 is a circuit diagram showing a distortion compensation circuit according to an embodiment of the sixth aspect of the invention.

Next, a distortion compensation circuit according to an embodiment of the sixth aspect of the invention is described below with reference to FIG. 11. FIG. 11 is a circuit diagram showing a distortion compensation circuit according an embodiment of the sixth aspect of the invention.

As shown in FIG. 11, in a distortion compensation circuit 100 according to an embodiment of the sixth aspect of the invention, a diode 105 directed in the forward direction is connected in series with a signal path between an input terminal 101 and an output terminal 102. In addition, an inductor 112 is connected in parallel with the diode 105. Furthermore, a resistor 113 is connected in parallel with the diode 105. Here, the diode 105 may be any diode whose impedance changes depending on an applied voltage.

Next, the operation of the distortion compensation circuit 100 according to the embodiment of the sixth aspect of the invention is described. A signal (RF) in the radio frequency band is input to the input terminal 101, and input to the diode 105. In the distortion compensation circuit 100, the resistance components (internal resistance) of the diode 105 in the radio frequency band decrease with an increase in input power, so that a direct current bypasses the inductor 112 connected in parallel with the diode 105, and the resistor 113 connected in parallel with the diode 105. Accordingly, the effect of the impedance of the inductor 112 connected in parallel with the diode 105 appears. That is, as the input power is increased, the impedance of the distortion compensation circuit 100 becomes inductive due to the effect of the impedance of the inductor 112, thus producing the characteristic that the phase is advanced. At the same time, although the resistance components of the diode 105 decrease with an increase in input power, it is possible to achieve the characteristic that the gain is maintained substantially constant by selecting the values of the inductor 112 and the resistor 113, and the constant of the diode 105.

Figure 12:
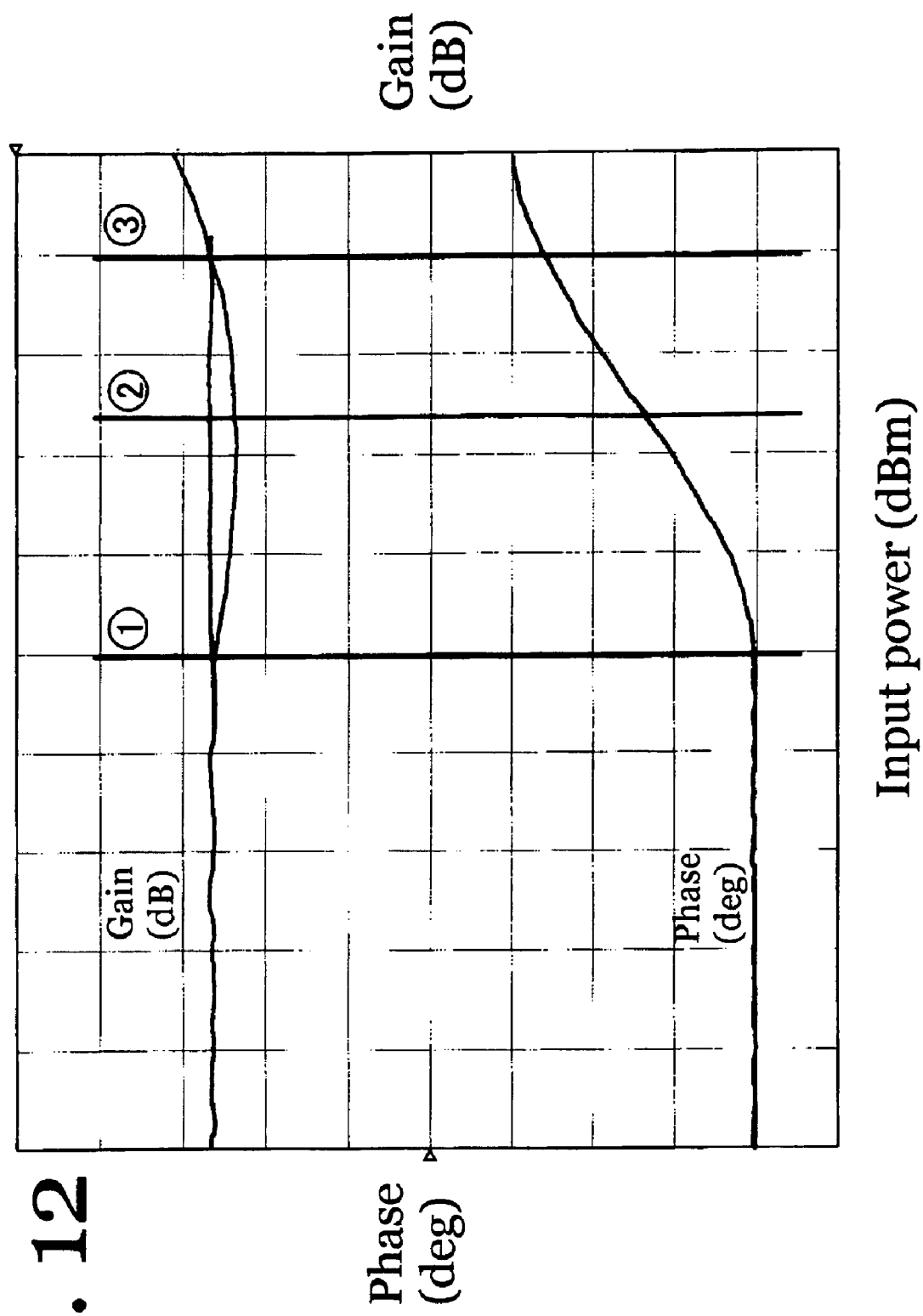
FIG. 12 is a graph showing the results of simulating the distortion compensation circuit according to the embodiment of the sixth aspect of the invention.

FIG. 12 shows the results of simulating the distortion compensation circuit 100 according to the above-described embodiment of the sixth aspect of the invention at a frequency of 1.64 GHz. In the simulation, the junction capacitance of the diode 105 when 0 V was applied to it was set to 0.7 pF, the value of the inductor 112 was set to 3.6 nH, and the value of the resistor 113 was set to 82 Ohm. As shown in FIG. 12, the distortion compensation circuit 100 has the characteristic that the phase is advanced with an increase in input power, while the gain is maintained substantially constant.

Figure 13:
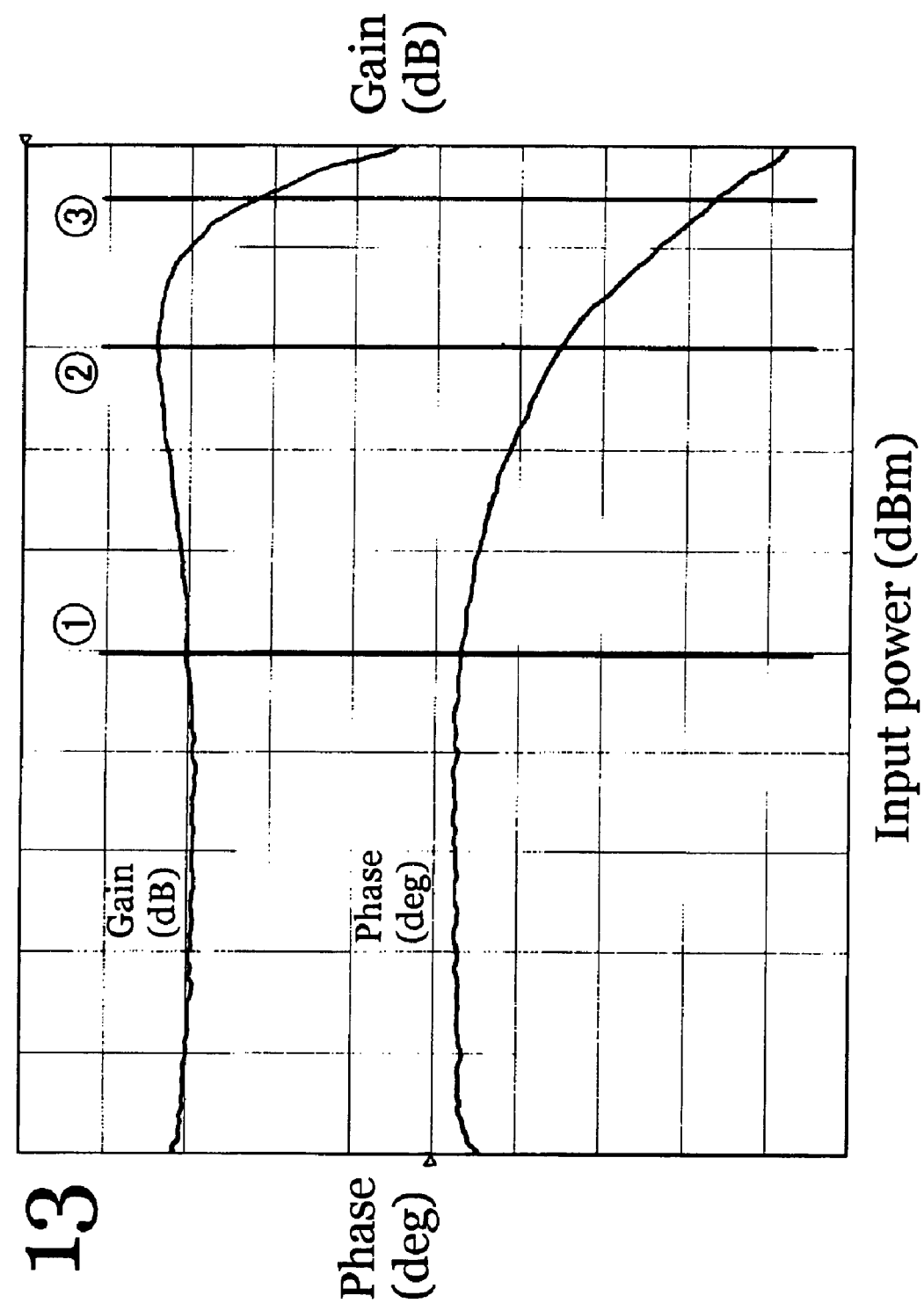
FIG. 13 is a graph showing the gain and phase characteristics with respect to input power of a multistage Si LDMOSFET high power amplifier.
Figure 14:
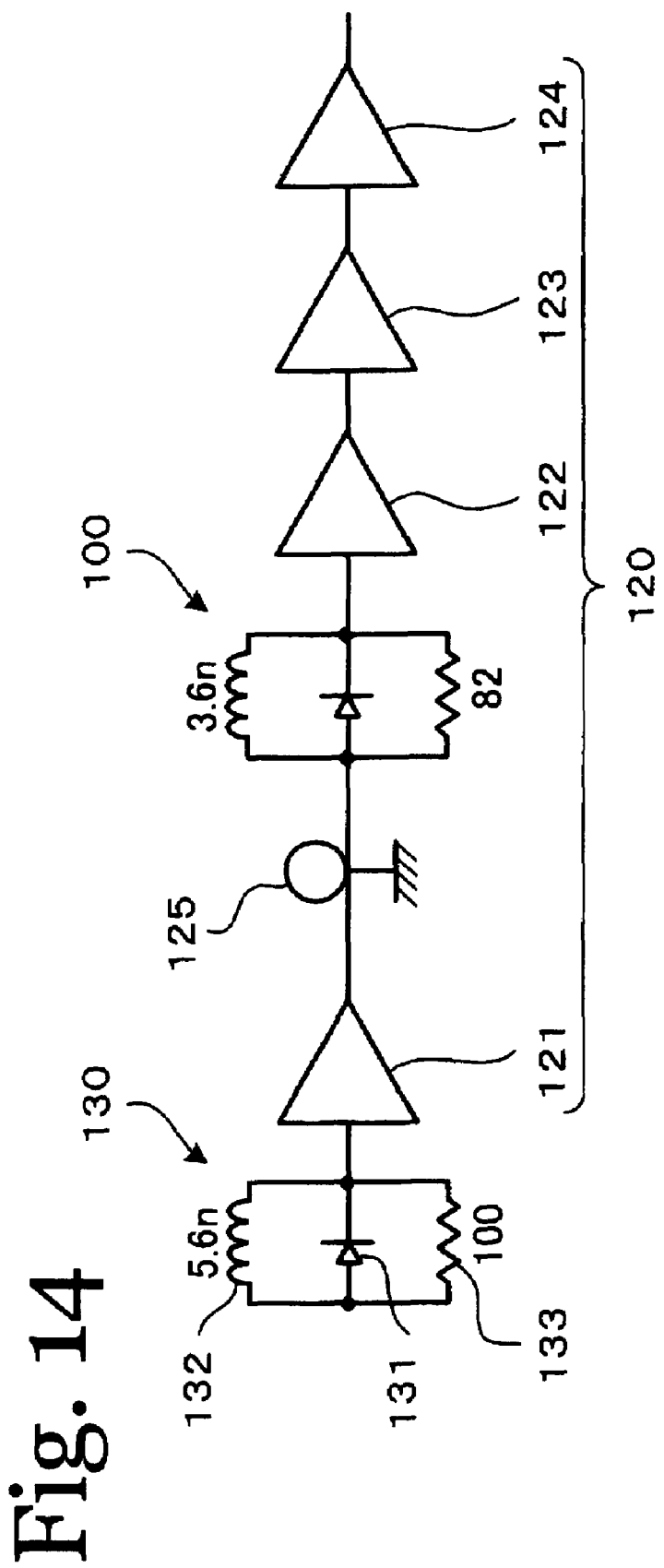
FIG. 14 is a circuit diagram showing an example in which the distortion compensation circuit according to the embodiment of the sixth aspect of the invention is connected to a multistage Si LDMOSFET high power amplifier.
Figure 15:
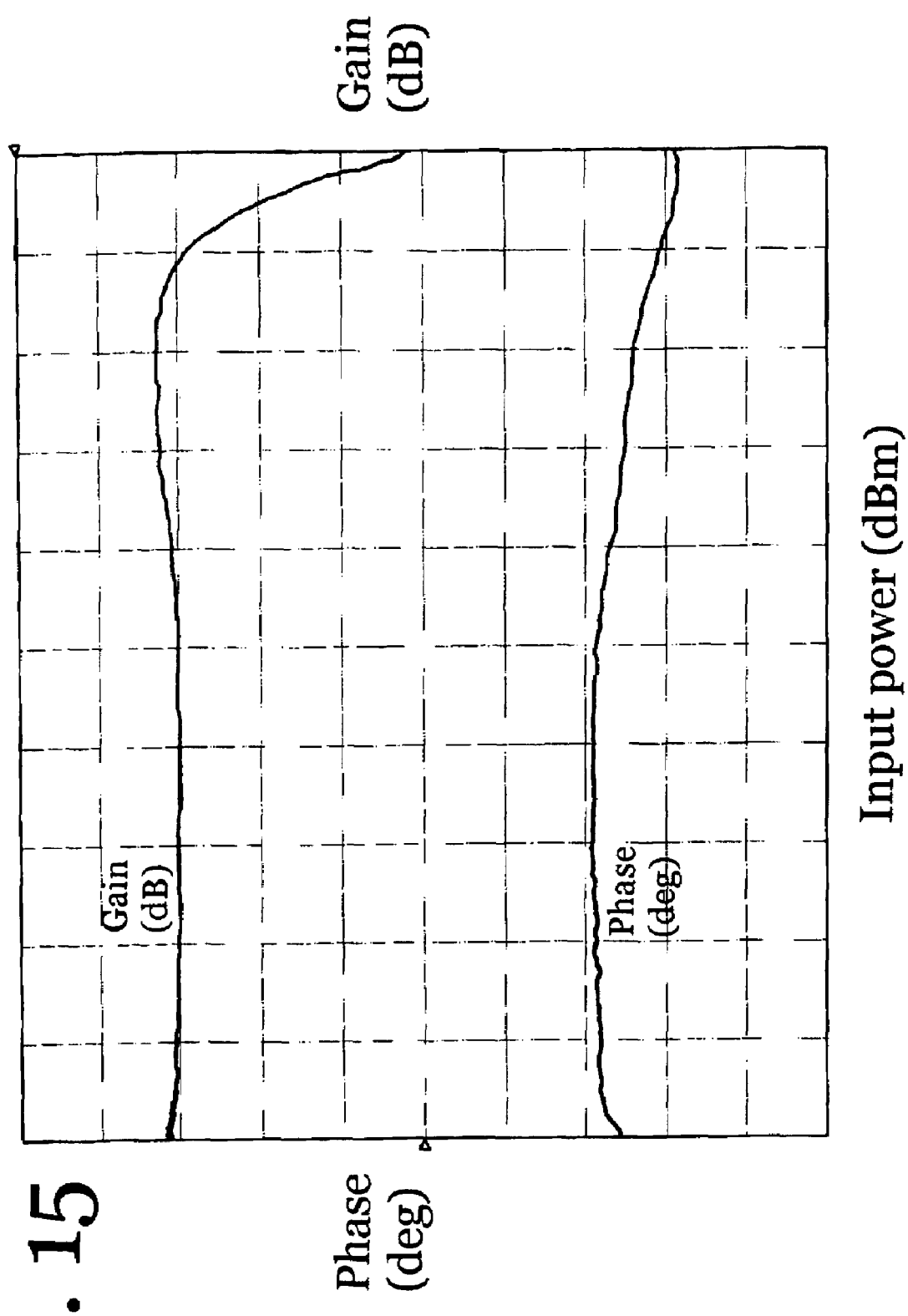
FIG. 15 is a graph showing the gain and phase characteristics with respect to input power in the circuit shown in FIG. 14.

Here, it is seen that the change with respect to increase in input power is more prominent for the phase delay than for the gain decrease in the gain characteristics and the phase characteristics of a multistage Si LDMOSFET high power amplifier, as shown in FIG. 13. Therefore, as shown in FIG. 14, in a multistage Si LDMOSFET high power amplifier 120 made up of four Si LDMOSFET high power amplifiers 121, 122, 123 and 124, a distortion compensation circuit 130 having the characteristic that the gain is increased and the phase is delayed is connected before the high power amplifier 121, and the distortion compensation circuit 100 according to the embodiment of the fifth aspect of the invention is connected between an isolator 125 and the high power amplifier 122. Here, the distortion compensation circuit 130 having the characteristic that the gain is increased and the phase is advanced is made up of a diode 131 (0.5 pF) connected in the forward direction, an inductor 132 (5.6 nH) connected in parallel with the diode 131, and a resistor 133 (100 Ohm) connected in parallel with the diode 131, as shown in FIG. 14. Then, the distortion of the multistage Si LDMOSFET high power amplifier 120 is improved as shown in FIG. 15, which is the graph showing the phase and gain characteristics of the circuit shown in FIG. 14.

As described above, with the distortion compensation circuit 100 according to the embodiment of the sixth aspect of the invention, it is possible to provide a distortion compensation circuit having the characteristic that only the phase is advanced, while the gain is maintained constant, by selecting the values of the inductor 112 and the resistor 113, and the constant of the diode 105. Here, in the multistage high power amplifier using a Si LDMOSFET, the change with respect to increase in input power is more prominent for the phase delay than for the gain decrease, so that it is possible to improve the linearity even more efficiently by combining it with distortion compensation circuits having the characteristic that the gain is increased and the phase is advanced with an increase in input power (for example, the distortion compensation circuits according to the embodiments of the first to fifth aspects of the invention) or distortion compensation circuits in which the gain is increased, while the phase is maintained substantially constant.

In the foregoing, the preferred embodiments of the present invention are described. However, the present invention is not limited to these embodiments. Various other embodiments are possible, without departing from the spirit and the scope of the present invention. Although the functions and effects provided by the configurations according to the present invention are described in the embodiments, these functions and effects are examples, and not to be construed to limit the invention. Additionally, the specific examples exemplify the configurations of the present invention, and not to be construed to limit the invention.

For example, the distortion compensation circuits 100 according to the above-described embodiments of the first to fourth aspects of the invention are applied to high power amplifiers using a Si LDMOSFET, but there is no limitation to this. The distortion compensation circuits 100 according to the embodiments of the first to fourth aspects of the invention can be applied to amplifiers having the characteristic that the gain is reduced and the phase is delayed with an increase in input power.

The bias circuit 108 in the distortion compensation circuits 100 according to the above-described embodiments of the first to fourth aspects of the invention is made up of the bias resistor 109 and the bias short circuit inductor 110, but there is no limitation to this. For example, the bias circuit 108 may also be constituted by the bias resistor 109 connected to the bias terminal 103, and a bias short circuit capacitor whose one end is connected to the signal path between the bias terminal 103 and the bias resistor 109 and whose other end is grounded.

Figure 16:
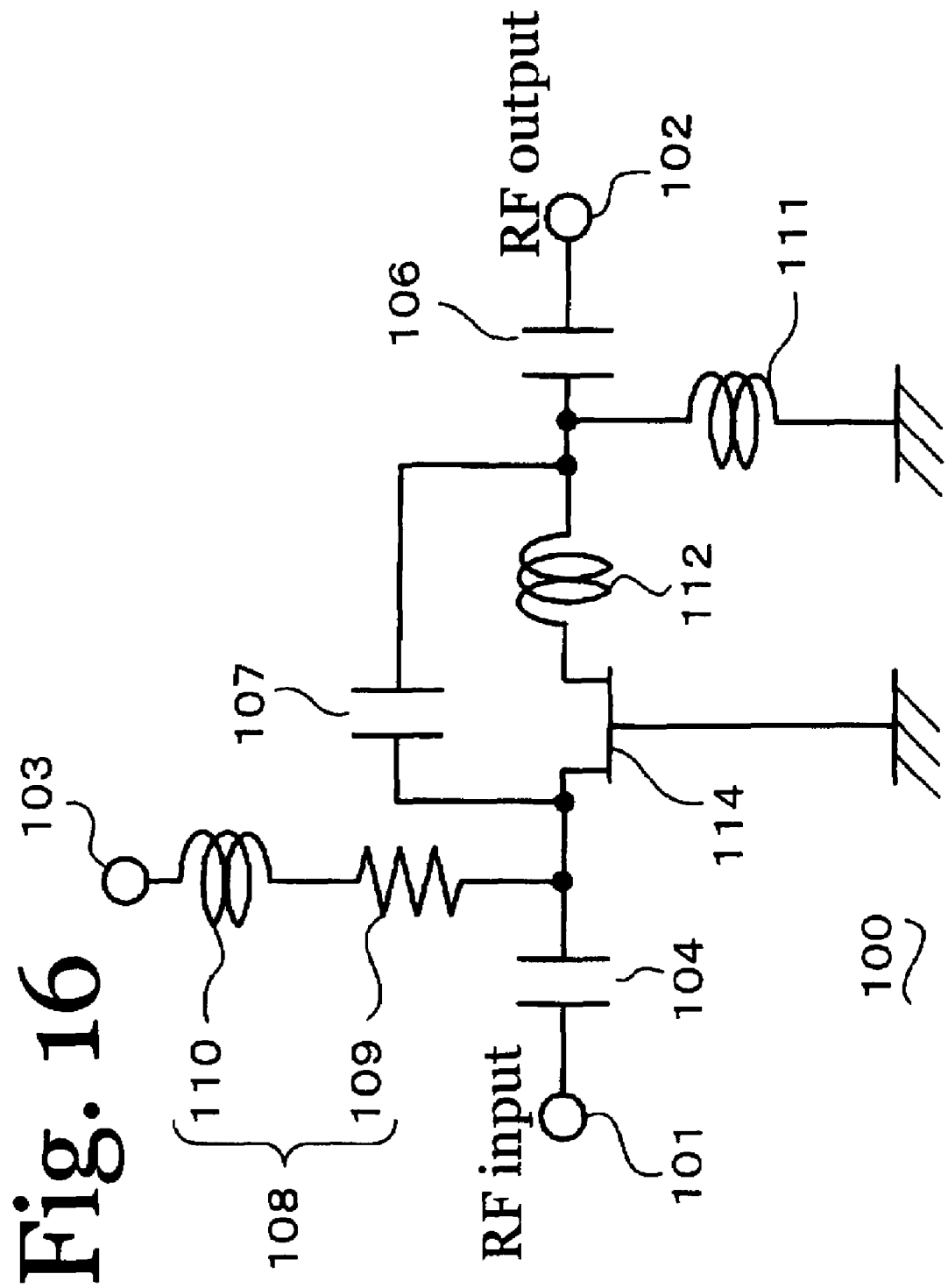
FIG. 16 is a circuit diagram showing a modification of the distortion compensation circuit according to the embodiment of the first aspect of the invention, in which a transistor is used.

A transistor whose gate is grounded may be used in place of the diode 105 in the distortion compensation circuits 100 according to the embodiments of the above-described first to fourth aspects of the invention. FIG. 16 shows a modification of the distortion compensation circuit 100 according to the embodiment of the first aspect of the invention, in which a transistor 114 whose gate is grounded is used in place of the diode 105. As shown in FIG. 16, a bias voltage is applied to the transistor 114 from the bias terminal 103 via the bias resistor 109 by the bias circuit 108. An effect similar to that of the diode 105 can be achieved by operating the transistor 114 as a variable resistor by adjusting the bias voltage to a voltage near the pinch-off of the transistor 114.

Figure 17:
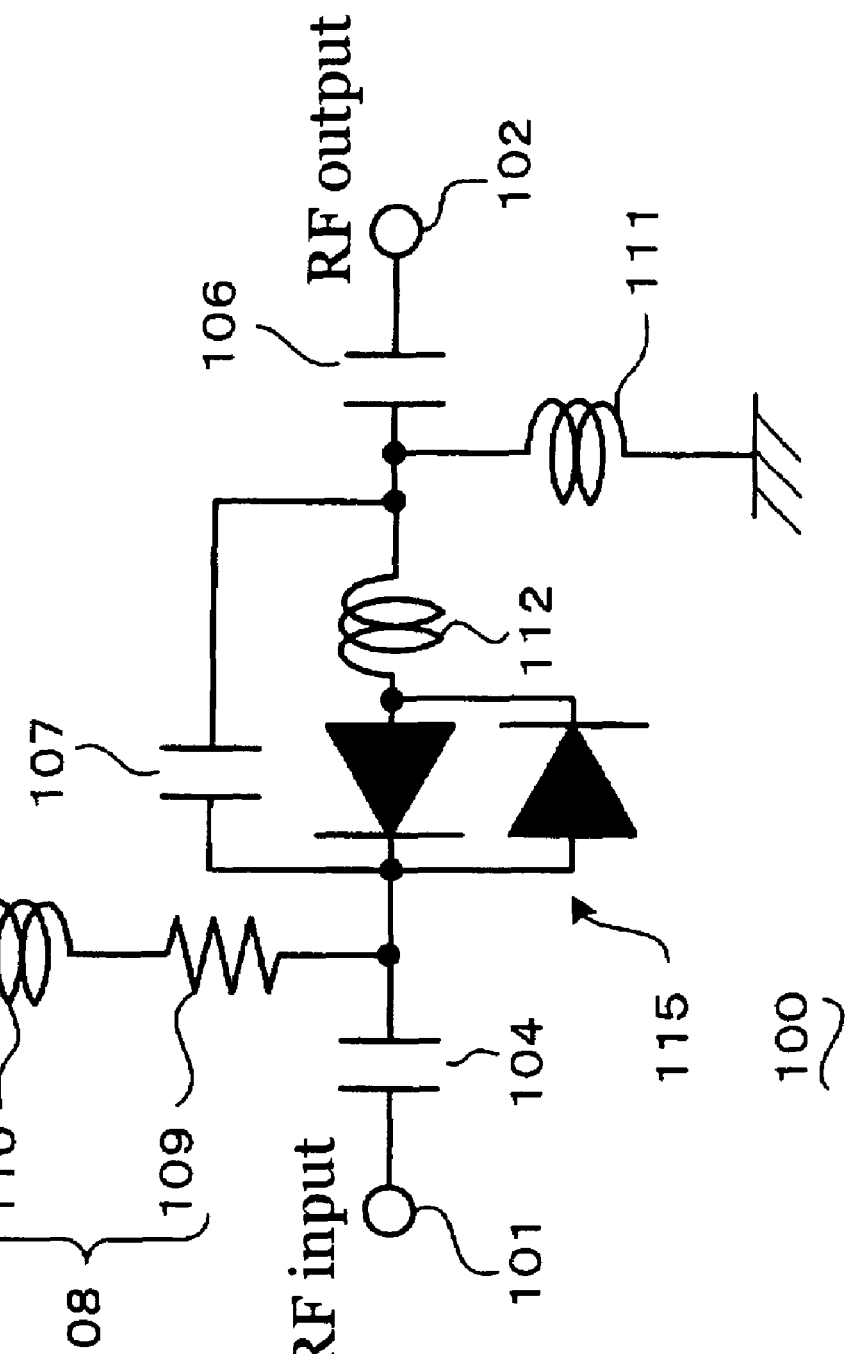
FIG. 17 is a circuit diagram showing a modification of the distortion compensation circuit according to the embodiment of the first aspect of the invention, in which an anti-parallel diode pair is used.
Figure 18:
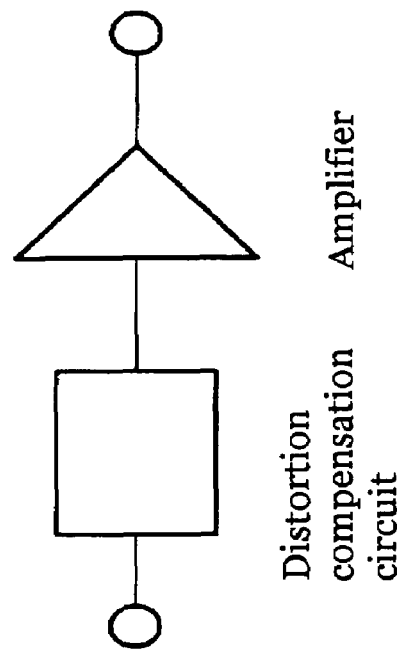
FIG. 18 shows the relationship between a distortion compensation circuit and a high power amplifier, wherein (a) is a circuit diagram showing an example in which the distortion compensation circuit is connected to the high power amplifier, and (b) shows graphs showing the distortion compensation characteristics of the distortion compensation circuit.
Figure 18:
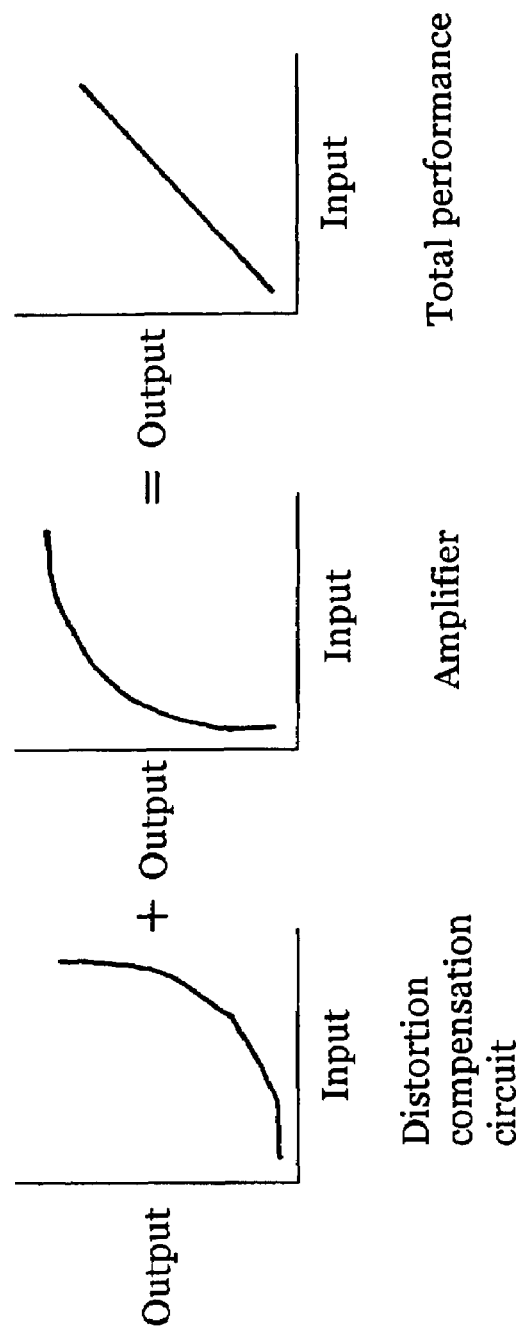
Figure 19:
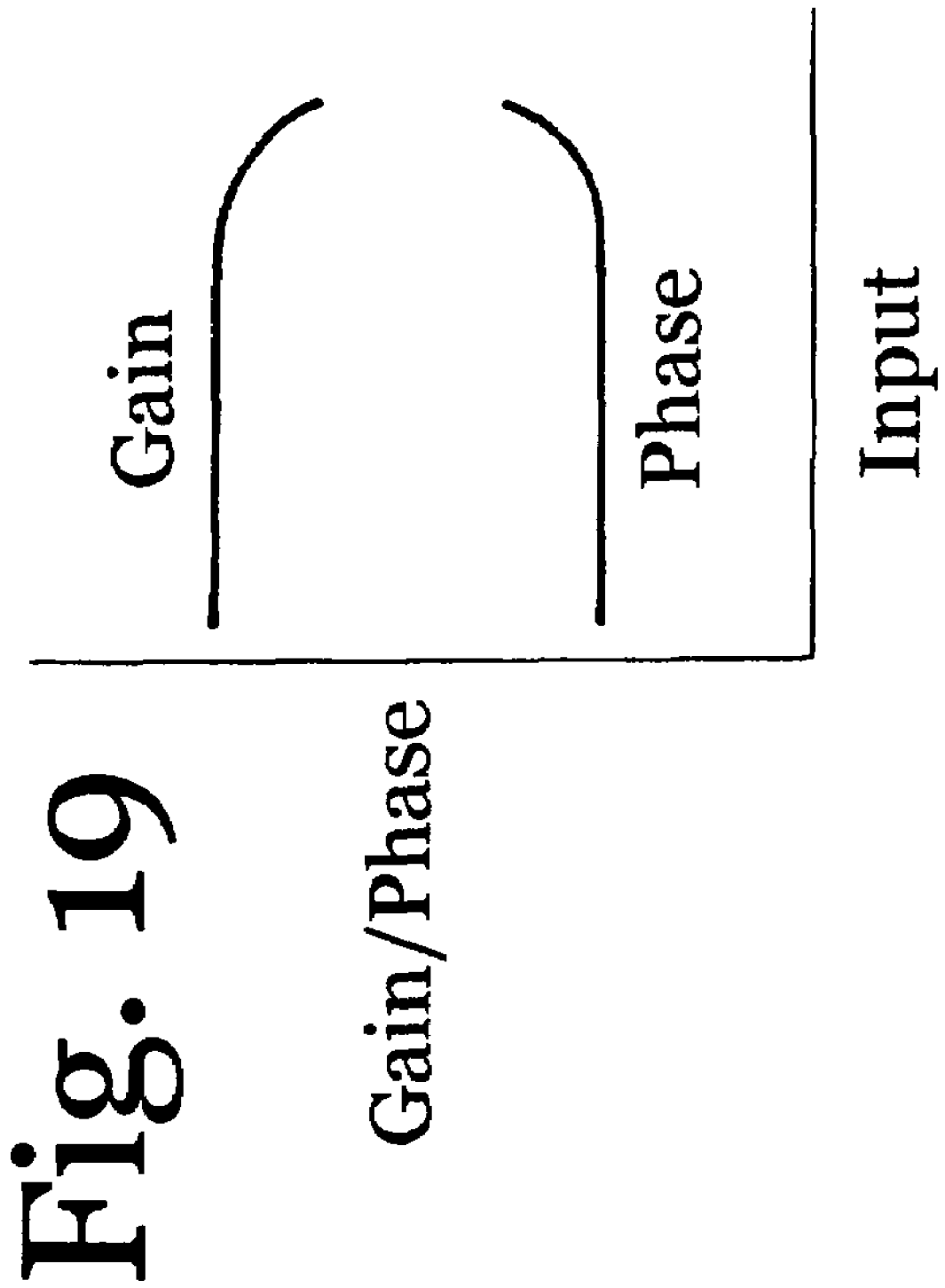
FIG. 19 is a graph showing the gain and phase characteristics with respect to input power of an amplifier using GaAs.
Figure 20:
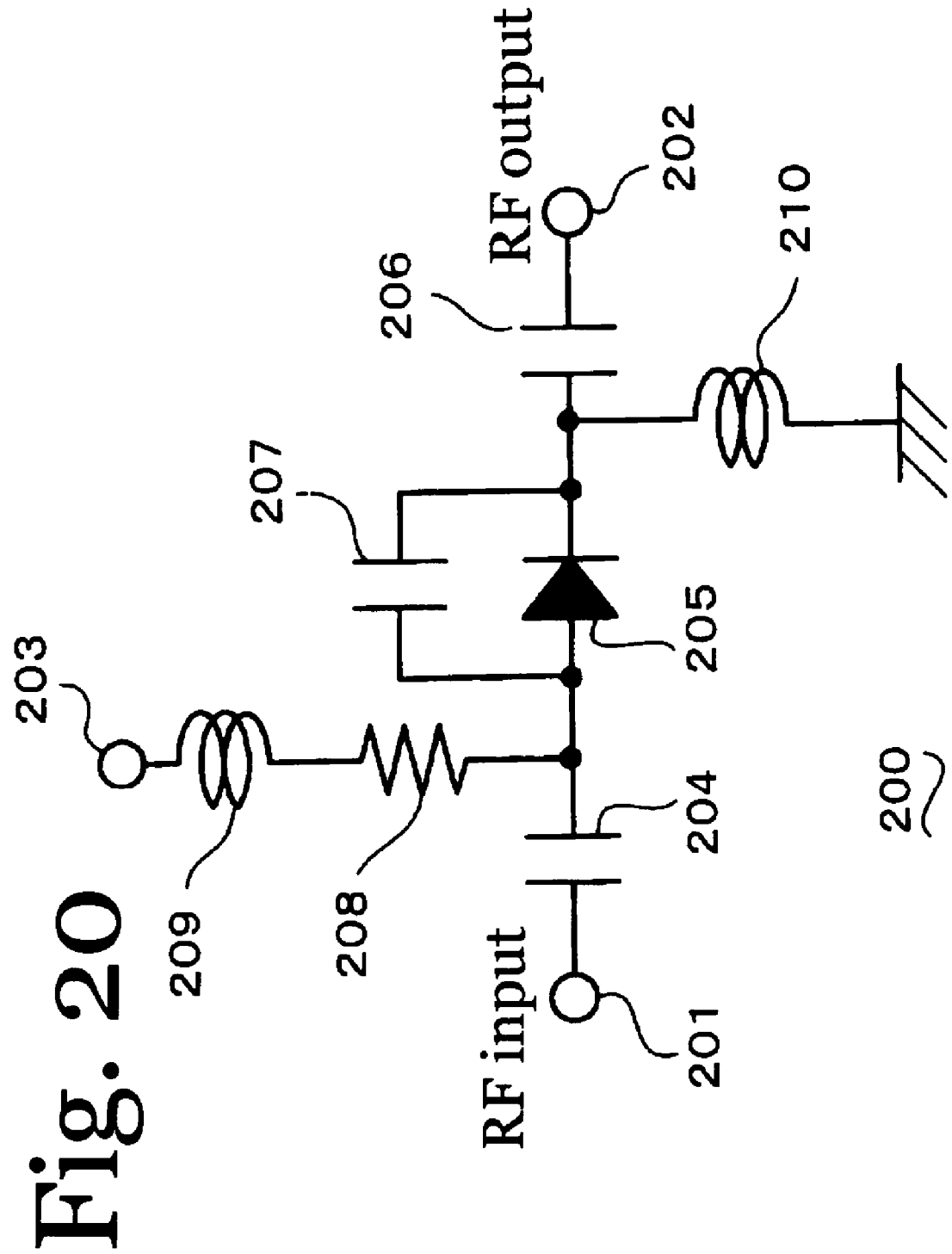
FIG. 20 is a circuit diagram showing an example of a conventional distortion compensation circuit.
Figure 21:
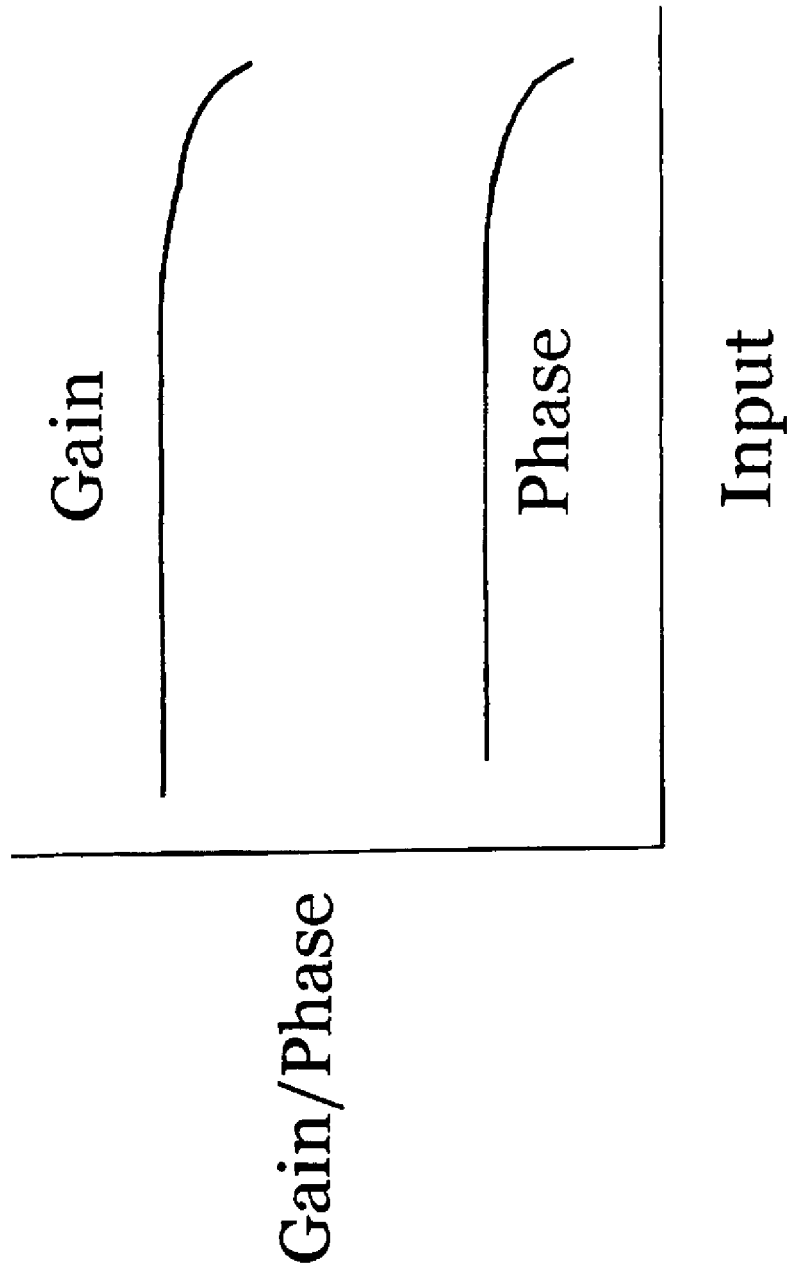
FIG. 21 is a graph showing the gain and phase characteristics with respect to input power of a high power amplifier using a Si LDMOSFET.

Furthermore, an anti-parallel diode pair may be used in place of the diode 105 in the distortion compensation circuits 100 according to the above-described embodiments of the first to fourth aspects of the invention. FIG. 17 shows a modification of the distortion compensation circuit 100 according to the embodiment of the first aspect of the invention, in which an anti-parallel diode pair 115 is used in place of the diode 105. As shown in FIG. 17, a bias voltage is applied to the anti-parallel diode pair 115 that operates as a switching circuit from the bias terminal 103 via the bias resistor 109 by the bias circuit 108. A bias power supply connected to the bias terminal 103 is used for adjusting the input threshold level of the gain and phase change of the anti-parallel diode pair 115. In the distortion compensation circuit 100, the resistance components (internal resistance) in the radio frequency band of the diodes constituting the anti-parallel diode pair 115 decrease with an increase in input power, so that the effect of the impedance of the inductor 112 connected in series with the anti-parallel diode pair 115 appears. That is, as the input power is increased, the impedance of the distortion compensation circuit 100 becomes inductive due to the effect of the impedance of the inductor 112, thus producing the characteristic that the phase is advanced. At the same time, the resistance components of the diodes constituting the anti-parallel diode pair 115 decrease with an increase in input power, thus producing the characteristic that the loss is reduced and the gain is increased. Moreover, the second harmonic wave components generated from the distortion compensation circuit 100 are reduced, making it possible to compensate for a third-order cross modulation distortion.

INDUSTRIAL APPLICABILITY

The present invention is applicable to a distortion compensation circuit that is connected before or after an amplifier for use.

The invention claimed is:

1. A distortion compensation circuit comprising:
    a signal path in which an input terminal, an input-side DC blocking capacitor, a diode connected in a forward direction, an inductor, an output-side DC blocking capacitor, and an output terminal are connected in series in this order;
    a bias circuit whose one end is connected to the signal path between the input-side DC blocking capacitor and the diode and whose other end is connected to a bias terminal;
    a bias short circuit inductor whose one end is connected to the signal path between the inductor and the output-side DC blocking capacitor and whose other end is grounded; and
    a capacitor connected in parallel with the diode and the inductor.

2. A distortion compensation circuit comprising:
    a signal path in which an input terminal, an input-side DC blocking capacitor, a diode connected in a forward direction, an output-side DC blocking capacitor, and an output terminal are connected in series in this order;
    a bias circuit whose one end is connected to the signal path between the input-side DC blocking capacitor and the diode and whose other end is connected to a bias terminal;
    a bias short circuit inductor whose one end is connected to the signal path between the diode and the output-side DC blocking capacitor and whose other end is grounded; and
    a series circuit comprising a capacitor and an inductor that are connected in parallel with the diode.

3. The distortion compensation circuit according to any one of claims 1 or 2,
    comprising a transistor, whose gate is grounded, in stead of the diode.

4. The distortion compensation circuit according to claim 1,
    wherein the distortion compensation circuit is pre- or post-connected to a high power amplifier using a Si LDMOS-FET.

\* \* \* \* \*